(12) United States Patent
Amano et al.

(10) Patent No.: US 12,237,293 B2
(45) Date of Patent: Feb. 25, 2025

(54) PALLADIUM-COATED COPPER BONDING WIRE, MANUFACTURING METHOD OF PALLADIUM-COATED COPPER BONDING WIRE, WIRE BONDING STRUCTURE USING THE SAME, SEMICONDUCTOR DEVICE AND MANUFACTURING METHOD THEREOF

(71) Applicant: TANAKA DENSHI KOGYO K. K., Saga (JP)

(72) Inventors: Hiroyuki Amano, Saga (JP); Yuki Antoku, Saga (JP); Takeshi Kuwahara, Saga (JP); Tsukasa Ichikawa, Saga (JP); Osamu Matsuzawa, Saga (JP); Wei Chen, Saga (JP)

(73) Assignee: TANAKA DENSHI KOGYO K. K., Kanzaki-gun (JP)

( * ) Notice: Subject to any disclaimer, the term of this patent is extended or adjusted under 35 U.S.C. 154(b) by 604 days.

(21) Appl. No.: 17/470,060

(22) Filed: Sep. 9, 2021

(65) Prior Publication Data

US 2022/0005781 A1 Jan. 6, 2022

Related U.S. Application Data

(63) Continuation of application No. PCT/JP2019/026646, filed on Jul. 4, 2019.

(30) Foreign Application Priority Data

Mar. 12, 2019 (JP) .................................. 2019-045143

(51) Int. Cl.
*H01L 23/495* (2006.01)
*H01L 23/00* (2006.01)

(52) U.S. Cl.
CPC ........ *H01L 24/45* (2013.01); *H01L 23/49582* (2013.01); *H01L 24/05* (2013.01);
(Continued)

(58) Field of Classification Search
CPC ......... H01L 24/45; H01L 24/43; H01L 24/85; H01L 24/05; H01L 24/48;
(Continued)

(56) References Cited

U.S. PATENT DOCUMENTS

| | | |
|---|---|---|
| 2010/0213619 A1 | 8/2010 | Uno et al. |
| 2010/0294532 A1 | 11/2010 | Uno et al. |
| 2017/0057020 A1 | 3/2017 | Amano et al. |

(Continued)

FOREIGN PATENT DOCUMENTS

| | | |
|---|---|---|
| JP | 2009-140942 A | 6/2009 |
| JP | 2011-146754 A | 7/2011 |

(Continued)

OTHER PUBLICATIONS

TW, Office Action for Taiwanese application No. 108124625, Oct. 12, 2021.
JP, Office Action for Japanese application No. 2021-505485, May 23, 2022.
(Continued)

*Primary Examiner* — Shaun M Campbell
*Assistant Examiner* — Teresa M. Arroyo
(74) *Attorney, Agent, or Firm* — ORRICK, HERRINGTON & SUTCLIFFE LLP; Richard Martinelli; K. Herman

(57) ABSTRACT

A Pd-coated Cu bonding wire of an embodiment contains Pd of 1.0 to 4.0 mass %, and a S group element of 50 mass ppm or less in total (S of 5.0 to 12.0 mass ppm, Se of 5.0 to 20.0 mass ppm, or Te of 15.0 to 50 mass ppm). At a crystal plane of a cross section of the wire, a <100> orientation ratio is 15% or more, and a <111> orientation ratio is 50% or less. When a free air ball is formed on the wire and a tip portion is analyzed, a Pd-concentrated region is observed on the surface thereof.

13 Claims, 5 Drawing Sheets

(52) U.S. Cl.
CPC .................. *H01L 24/48* (2013.01); *H01L 2224/04042* (2013.01); *H01L 2224/05624* (2013.01); *H01L 2224/45147* (2013.01); *H01L 2224/45664* (2013.01); *H01L 2224/4845* (2013.01); *H01L 2224/85035* (2013.01); *H01L 2924/01016* (2013.01); *H01L 2924/01034* (2013.01); *H01L 2924/01052* (2013.01)

(58) Field of Classification Search
CPC ........... H01L 23/49582; H01L 23/4952; H01L 23/522; H01L 21/3205; H01L 21/768; H01L 2924/01016; H01L 2924/01034; H01L 2924/01052; H01L 2224/04042; H01L 2224/05624; H01L 2224/45147; H01L 2224/45664; H01L 2224/4845; H01L 2224/85035; H01L 2224/45565; H01L 2224/05554; H01L 2224/48247; H01L 2224/48463; H01L 2224/8503; H01L 2224/85207; H01L 2224/85439; H01L 2224/85444
See application file for complete search history.

(56) References Cited

U.S. PATENT DOCUMENTS

| | | | |
|---|---|---|---|
| 2017/0117244 | A1 | 4/2017 | Yamada et al. |
| 2017/0125135 | A1 | 5/2017 | Amano et al. |
| 2017/0200689 | A1* | 7/2017 | Yamada .................. C22C 5/04 |
| 2020/0373226 | A1* | 11/2020 | Oda ........................ H01L 24/48 |
| 2021/0280553 | A1* | 9/2021 | Amano ................... H01L 24/45 |

FOREIGN PATENT DOCUMENTS

| | | |
|---|---|---|
| JP | 2012-156307 A | 8/2012 |
| JP | 2017-092078 A | 5/2017 |
| JP | 2018-137487 A | 8/2018 |
| TW | 2012079971 A | 2/2012 |
| TW | 201711117 A | 3/2017 |
| WO | WO 2016/189758 A1 | 12/2016 |

OTHER PUBLICATIONS

PCT, International Search Report for PCT/JP2019/026646, Aug. 13, 2019.

* cited by examiner

PALLADIUM-COATED COPPER BONDING WIRE, MANUFACTURING METHOD OF PALLADIUM-COATED COPPER BONDING WIRE, WIRE BONDING STRUCTURE USING THE SAME, SEMICONDUCTOR DEVICE AND MANUFACTURING METHOD THEREOF

CROSS-REFERENCE TO RELATED APPLICATION

This application is a continuation of prior International Application No. PCT/JP2019/026646, filed on Jul. 4, 2019 which is based upon and claims the benefit of priority from Japanese Patent Application No. 2019-045143, filed on Mar. 12, 2019; the entire contents of all of which are incorporated herein by reference.

FIELD

The present invention relates to a palladium-coated copper bonding wire suitable for ball bonding of an electrode of a semiconductor element and an external electrode, a manufacturing method thereof, a wire bonding structure using the same, a semiconductor device and a manufacturing method thereof.

BACKGROUND

In general, an electrode of a semiconductor element and an external electrode on a circuit wiring board for semiconductors are connected by wire bonding. The wire bonding has one end to be connected to the electrode of the semiconductor element, and the other end to be connected to the external electrode. The one end is bonded to the electrode of the semiconductor element by a method called ball bonding (first bonding), and the other end is bonded to the external electrode by a method called wedge bonding (second bonding). In the ball bonding, a molten ball is formed at a tip of a bonding wire, and the bonding wire is connected to a surface of an aluminum electrode on the semiconductor element, for example, via the molten ball.

When forming the molten ball, the tip of the bonding wire is first held vertically, and an arc discharge is formed between the tip and a discharge torch using the Electronic Flame-Off (EFO) method. By a discharge current thereof, the tip of the bonding wire is heated to be melted. A molten metal rises through the wire due to its surface tension, and a spherical molten ball is formed at the tip of the wire. The spherical molten ball is solidified, and thereby a free air ball (FAB) is formed. The free air ball is crimped onto the electrode with ultrasonic waves being applied thereto while heating the electrode of the semiconductor element to about 140 to 300° C., and thereby one end of the bonding wire is bonded onto the aluminum electrode.

Although a gold wire having a diameter of about 10 to 30 μm has been used for the wire bonding, gold is very expensive, so that a copper wire has been used in a replaceable portion partly. However, the copper wire is easily oxidized, so that in order to prevent the oxidation, a palladium-coated copper wire with a palladium-coated surface has come to be used.

However, the palladium-coated copper wire has an issue of achieving both the stability of bonding to the aluminum electrode and the loop stability because the surface of the ball is oxidized, for example. In response to this, for example, there has been proposed a palladium-coated copper wire containing sulfur in a copper core material.

Although the palladium-coated copper wire suffers from the problem of oxidation of wires or free air balls inherent in copper itself, as well as the problem of improving the properties that tend to be impaired by coating, copper is less expensive than gold. Accordingly, the palladium-coated copper wire has rapidly become popular for use under relatively moderate conditions in consumer devices such as personal computers, peripheral devices thereof, and communications devices, and so on. Furthermore, in recent years, improvements of the palladium-coated copper wire have been in progress, and a shift of bonding wires, which are used under severe conditions, such as in devices for automobile use, to the palladium-coated copper wire has been in progress as well. For this reason, the palladium-coated copper wire is required to be able to withstand extremely severe and rapidly changing conditions to be suitable for the devices for automobile use. Concretely, the palladium-coated copper wire is required to withstand a wide range of natural environments and their changes, from high-temperature and high-humidity regions such as the tropics and deserts to cold regions, and from mountainous regions to coastal regions, as well as to withstand shocks and vibrations caused by road and traffic conditions. In addition, in recent years, the application to semiconductor products to be installed in aircraft as well as in an engine compartment of automobiles has come under consideration. For this reason, there is a need for the palladium-coated copper bonding wire that meets the requirements of higher levels of bonding reliability than ever before, which can withstand the use under relatively moderate conditions of consumer applications as well as severe conditions.

In the process of developing the palladium-coated copper wire that meets such requirements for high reliability, attempts have been made to improve the bonding life by forming an alloy layer or a concentrated layer with a high concentration of palladium on the surface of the free air ball.

Further, for the purpose of increasing formability and bondability of a ball portion, and so on, adjustment of a composition in the vicinity of a ball bonding portion has been performed.

SUMMARY OF THE INVENTION

By increasing the concentration of palladium of the surface of the free air ball, the bonding life of the palladium-coated copper wire has improved as compared to a conventional wire (a wire used in applications in relatively moderate conditions and in which the concentration of palladium of the surface of the free air ball is not increased). However, it has been found out that when such a palladium-coated copper wire is used under severe conditions, the bonding life does not often extend so much.

The present inventors observed a large shrinkage cavity formed in the surface of the free air ball in such a palladium-coated copper wire whose bonding life did not extend, and presumed that this would be a factor inhibiting the extension of the bonding life. Specifically, they considered that when the free air ball having a shrinkage cavity was bonded onto the aluminum electrode, a void would be formed at the bonding interface, and this void served as a starting point for corrosion to progress, resulting in a decrease in the bonding life.

As a result of the intensive investigation into the cause of this problem, the present inventors concluded that some of the gold or silver plated on the surface of the external electrode adhered to an end portion of the wire that was torn off after the second bonding, and this gold or silver served as a starting point to form a shrinkage cavity in the free air ball.

Further, according to significant high-integration and high-density of semiconductor elements in recent years, requirements for wire bonding regarding narrowing of pitch, thinning of wire, increase in the number of pins, increase in the length of wire, and so on, has become strict. Among the above, the narrowing of pitch has been rapidly accelerated, and in the current mass-production level, a 60 μm pitch is realized, and development of a 50 μm pitch is in progress. Furthermore, practical application of extremely-narrow pitch of 45 μm, 40 μm, or the like, is being expected. In the extremely-narrow pitch bonding, a small-diameter ball of a first bonding portion having a ball diameter smaller than that of normal bonding is used, and as bonding with narrower pitch is performed, high circularity in the first bonding is required more. This is because, if the circularity in the first bonding is reduced to increase anisotropy, adjacent wires are brought into contact with each other to cause short failure.

Further, even if the composition of the ball bonding portion when the palladium-coated copper wire is bonded onto the electrode is tried to be controlled, it is extremely difficult to stably control the composition, which has been problematic.

The present invention has been made in order to solve the above-described problems, and an object thereof is to provide a palladium-coated copper bonding wire causing no problematic large shrinkage cavity to be formed in a surface of a ball during ball formation, capable of stably maintaining bonding reliability of ball bonding even in high-temperature and high-humidity environments, and capable of improving circularity of a shape of first bonding even in narrow-pitch bonding, and a manufacturing method thereof. Further, an object of the present invention is to provide a semiconductor device capable of stably maintaining bonding reliability even in high-temperature and high-humidity environments, and capable of improving circularity of a shape of first bonding even in narrow-pitch bonding, particularly a semiconductor device suitable for packages of QFP (Quad Flat Packaging), BGA (Ball Grid Array), and QFN (Quad For Non-Lead Packaging) and capable of being used for automotive application, and a manufacturing method thereof.

A palladium-coated copper bonding wire of the present invention includes: a core material containing copper as a main component; and a palladium layer on the core material, and contains a sulfur group element. The palladium-coated copper bonding wire contains, relative to the total of copper, palladium, and the sulfur group element, palladium of 1.0 mass % or more and 4.0 mass % or less, and the sulfur group element of 50 mass ppm or less in total (sulfur of 5.0 mass ppm or more and 12.0 mass ppm or less, selenium of 5.0 mass ppm or more and 20.0 mass ppm or less, or tellurium of 15.0 mass ppm or more and 50.0 mass ppm or less). In crystal orientations <hkl> in a wire longitudinal direction at a crystal plane of a cross section of the palladium-coated copper bonding wire, a <100> orientation ratio is 15% or more in total, and a <111> orientation ratio is 50% or less. The <100> orientation and the <111> orientation include an orientation with an angular difference relative to the wire longitudinal direction of within 15°. When a free air ball is formed on the palladium-coated copper bonding wire, a palladium-concentrated region containing palladium of 6.5 atom % or more and 30.0 atom % or less relative to the total of copper and palladium, is observed in a range from a surface of a tip portion of the free air ball to 5.0 nm or more and 100.0 nm or less in a depth direction.

In the palladium-coated copper bonding wire of the present invention, the core material preferably contains one or more of trace elements selected from P, Au, Pd, Pt, Ni, Ag, Rh, In, Ga, and Fe, of 1 mass ppm or more and 3 mass % or less in total relative to the entire core material. Further, when the core material contains one or more selected from Au, Pd, Pt, Ni, and Rh, as the trace elements, a total content thereof is preferably 0.05 mass % or more and 3 mass % or less, when the core material contains one or more of In and Ga, a total content thereof is preferably 0.01 mass % or more and 0.7 mass % or less, when the core material contains P, a content thereof is preferably 5 mass ppm or more and 500 mass ppm or less, and when the core material contains one or more of Ag and Fe, a total content thereof is preferably 1 mass ppm or more and 100 mass ppm or less.

In the palladium-coated copper bonding wire of the present invention, a concentration of palladium derived from the palladium layer is preferably 1.0 mass % or more and 2.5 mass % or less relative to the total of copper, palladium, and the sulfur group element.

A diameter of the palladium-coated copper bonding wire of the present invention is preferably 10 μm or more and 25 μm or less.

In the palladium-coated copper bonding wire of the present invention, free air ball forming conditions when detecting the palladium-concentrated region are preferably that a discharge current value is 65 mA and a ball diameter is 1.8 times the diameter of the wire, in the presence of a mixed gas of nitrogen and hydrogen.

In the palladium-coated copper bonding wire of the present invention, the concentration of palladium of the palladium-concentrated region is preferably a concentration which is obtained when performing measurement by setting Auger electron spectroscopy analysis conditions, which are an acceleration voltage of a primary electron beam of 10 kV, a measurement region calculated from a set value of 15 μm$^2$ or more and 20 μm$^2$ or less, an acceleration voltage of argon ion sputtering of 1 kV, and a sputtering rate of 2.5 nm/minute (in terms of SiO$_2$) as setting conditions of a device.

The palladium-coated copper bonding wire of the present invention preferably has a gold layer on the palladium layer.

A manufacturing method of a palladium-coated copper bonding wire of the present invention manufactures a palladium-coated copper bonding wire including: a core material containing copper as a main component; and a palladium layer on the core material, and containing a sulfur group element. The palladium-coated copper bonding wire contains, relative to the total of copper, palladium, and the sulfur group element, palladium of 1.0 mass % or more and 4.0 mass % or less, and the sulfur group element of 50 mass ppm or less in total (sulfur (S) of 5.0 mass ppm or more and 12.0 mass ppm or less, selenium (Se) of 5.0 mass ppm or more and 20.0 mass ppm or less, or tellurium (Te) of 15.0 mass ppm or more and 50.0 mass ppm or less). The manufacturing method includes: preparing a copper wire rod containing copper as a main component; forming a palladium layer containing the sulfur group element on a surface of the copper wire rod; drawing the copper wire rod having the palladium layer formed thereon by 50% or more; and performing heat treatment to make an elongation percentage of the drawn copper wire rod to be 5% or more and 15% or less.

A wire bonding structure of the present invention includes: an aluminum-containing electrode of a semiconductor chip; a bonding wire; and a ball bonding portion between the electrode and the bonding wire. The bonding wire is a palladium-coated copper bonding wire including: a core material containing copper as a main component; and a palladium layer on the core material, and containing a sulfur group element. The palladium-coated copper bonding wire contains, relative to the total of copper, palladium, and the sulfur group element, palladium of 1.0 mass % or more and 4.0 mass % or less, and the sulfur group element of 50 mass ppm or less in total (sulfur (S) of 5.0 mass ppm or more and 12.0 mass ppm or less, selenium (Se) of 5.0 mass ppm or more and 20.0 mass ppm or less, or tellurium (Te) of 15.0 mass ppm or more and 50.0 mass ppm or less). In crystal orientations <hkl> in a wire longitudinal direction at a crystal plane of a cross section of the palladium-coated copper bonding wire, a <100> orientation ratio is 15% or more, and a <111> orientation ratio is 50% or less. The <100> orientation and the <111> orientation include an orientation with an angular difference relative to the wire longitudinal direction of within 15°. When a wire bonding structure in which the palladium-coated copper bonding wire is ball-bonded onto an aluminum electrode is produced, a palladium-concentrated bonding region whose concentration of palladium is 2 mass % or more relative to the total of aluminum, palladium, and copper, exists in the vicinity of a bonding surface of the ball bonding on the aluminum electrode.

In the wire bonding structure of the present invention, it is preferable that the palladium-concentrated bonding region is disposed at least on lines parallel to the wire longitudinal direction, the lines each passing through a position at a distance of one-eighth from each of both ends of a maximum width of the ball bonding.

In the wire bonding structure of the present invention, it is preferable that an occupancy ratio of the palladium-concentrated bonding region in the vicinity of the bonding surface is 25% or more.

A semiconductor device of the present invention includes: a semiconductor chip; an aluminum-containing aluminum electrode provided on the semiconductor chip; a gold or silver-coated external electrode provided outside the semiconductor chip; and a bonding wire connecting the aluminum electrode and a surface of the external electrode. The bonding wire is made of a palladium-coated copper wire. The above-described wire bonding structure of the present invention exists in the vicinity of a bonding surface between the aluminum electrode and the bonding wire.

A semiconductor device of the present invention includes: a semiconductor chip; an aluminum-containing aluminum electrode provided on the semiconductor chip; a gold or silver-coated external electrode provided outside the semiconductor chip; and a bonding wire connecting the aluminum electrode and a surface of the external electrode. The bonding wire is made of the above-described palladium-coated copper bonding wire of the present invention.

The semiconductor device of the present invention is preferably QFP (Quad Flat Packaging), BGA (Ball Grid Array), or QFN (Quad For Non-Lead Packaging). Further, the semiconductor device of the present invention is preferably for automotive applications.

The wire bonding structure of the present invention can be formed in a manner that the palladium-coated copper bonding wire having the above-described configuration is used, a free air ball is formed and the ball is bonded onto an aluminum-containing electrode of a semiconductor chip. At this time, the palladium-concentrated bonding region with the specific composition described above is formed in the vicinity of the bonding surface of the ball bonding. For this reason, it is possible to significantly improve the bonding reliability of the first bonding (ball bonding). In other words, when performing a bonding test in which a wire bonding structure is produced by the above-described ball bonding with the use of the palladium-coated copper wire with the configuration described above, the palladium-concentrated bonding region with the specific composition described above is formed in the vicinity of the bonding surface of the ball bonding. As a result of this, it is possible to significantly improve the bonding reliability of the first bonding (ball bonding).

A manufacturing method of a semiconductor device of the present invention manufactures a semiconductor device including: a semiconductor chip; an aluminum-containing aluminum electrode provided on the semiconductor chip; a gold or silver-coated external electrode provided outside the semiconductor chip; and a bonding wire connecting the aluminum electrode and a surface of the external electrode. The bonding wire is a palladium-coated copper bonding wire including: a core material containing copper as a main component; and a palladium layer on the core material, and containing a sulfur group element. The palladium-coated copper bonding wire contains, relative to the total of copper, palladium, and the sulfur group element, palladium of 1.0 mass % or more and 4.0 mass % or less, and the sulfur group element of 50 mass ppm or less in total (sulfur of 5.0 mass ppm or more and 12.0 mass ppm or less, selenium of 5.0 mass ppm or more and 20.0 mass ppm or less, or tellurium of 15.0 mass ppm or more and 50.0 mass ppm or less). In crystal orientations <hkl> in a wire longitudinal direction at a crystal plane of a cross section of the palladium-coated copper bonding wire, a <100> orientation ratio is 15% or more in total, and a <111> orientation ratio is 50% or less. The <100> orientation and the <111> orientation include an orientation with an angular difference relative to the wire longitudinal direction of within 15°. When a free air ball is formed on the palladium-coated copper bonding wire, a palladium-concentrated region containing palladium of 6.5 atom % or more and 30.0 atom % or less relative to the total of copper and palladium, is observed in a range from a surface of a tip portion of the free air ball to 5.0 nm or more and 100.0 nm or less in a depth direction. The manufacturing method includes: forming a free air ball at the tip of the palladium-coated copper bonding wire; making the palladium-coated copper bonding wire to be ball-bonded to the aluminum electrode via the free air ball; and making a portion of the palladium-coated copper bonding wire apart from the free air ball by a length of the palladium-coated copper bonding wire to be bonded to the surface of the external electrode.

The sulfur group element is at least one or more of sulfur (S), selenium (Se), and tellurium (Te). Further, the <111> crystal orientation ratio (<111> orientation ratio) means a ratio of crystal orientation including one with an angular difference relative to a wire longitudinal direction of up to within 15°, in crystal orientations <hkl> in the wire longitudinal direction, unless otherwise indicated. In like manner, the <100> crystal orientation ratio (<100> orientation ratio) also means a ratio of crystal orientation including one with an angular difference of up to within 15°.

Effect of the Invention

According to the palladium-coated copper bonding wire and the wire bonding structure of the present invention, a problematic large shrinkage cavity is not formed in a surface of a ball during ball formation, and even in narrow-pitch bonding, it is possible to improve circularity of a shape of first bonding. For this reason, when used for ball bonding, it is possible to suppress occurrence of short failure even in the narrow-pitch bonding, and excellent bonding reliability can be stably maintained for a long period of time even in high-temperature and high-humidity environments. Further, according to the semiconductor device of the present invention and the manufacturing method thereof, it is possible to suppress occurrence of short failure in narrow-pitch bonding, and excellent bonding reliability can be stably maintained for a long period of time even in high-temperature and high-humidity environments.

DETAILED DESCRIPTION

Figure 1:
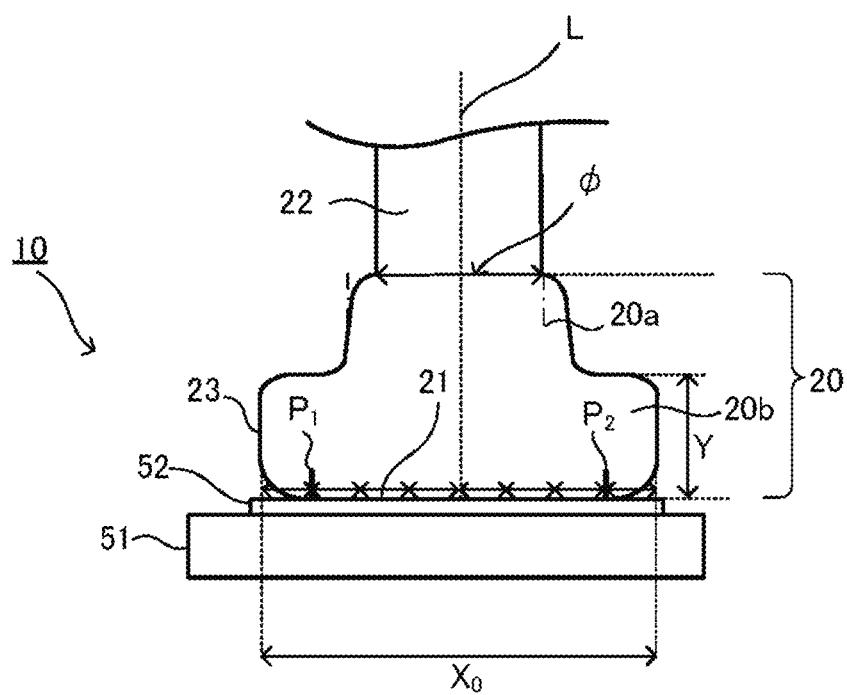
FIG. 1 is a view for explaining a formation place of a palladium-concentrated bonding region.

Hereinafter, embodiments of the present invention will be described in detail.

A palladium (Pd)-coated copper bonding wire of the present embodiment includes a core material containing copper as a main component, and a palladium layer on the core material. The palladium-coated copper bonding wire contains a sulfur group element, in which, relative to the total of copper, palladium, and the sulfur group element, a concentration of palladium is 1.0 to 4.0 mass %, and when two or more of the sulfur group elements are contained, the total concentration of them is 50 mass ppm or less. In crystal orientations <hkl> in a wire longitudinal direction at a crystal plane of a cross section of the core material of the palladium-coated copper bonding wire, a <100> orientation ratio is 15% or more, and a <111> orientation ratio is 50% or less. The <100> orientation and the <111> orientation include an orientation with an angular difference relative to the wire longitudinal direction of up to within 15°.

In the palladium-coated copper bonding wire of the present embodiment, out of the sulfur group elements, a concentration of sulfur is 5 mass ppm or more and 12 mass ppm or less, a concentration of selenium is 5 mass ppm or more and 20 mass ppm or less, or a concentration of tellurium is 15 mass ppm or more and 50 mass ppm or less.

Attributes of the palladium-coated copper bonding wire of the present embodiment can be checked through an analysis of a tip of a free air ball formed by using the palladium-coated copper bonding wire (analysis of FAB-attached wire). Specifically, since the palladium-coated copper bonding wire of the present embodiment has the aforementioned composition, when the free air ball (FAB) is formed and its tip portion is analyzed, a palladium-concentrated region containing palladium of 6.5 to 30.0 atom % relative to the total of copper and palladium, is observed in a range from a surface of the tip portion of FAB to 5.0 nm or more and 100.0 nm or less in a depth direction. Further, in the palladium-coated copper bonding wire of the present embodiment, when a bonding structure is formed by performing ball bonding by using the palladium-coated copper bonding wire having the above-described composition, a palladium-concentrated bonding region (a region in which a mass ratio of palladium relative to the total of palladium, copper, and aluminum becomes 2.0 mass % or more, preferably 5.0 mass % or more) is formed in the vicinity of a bonding surface, namely, a region where aluminum and palladium coexist. The ball bonding conditions and analysis conditions will be described later in detail.

In other words, whether or not a palladium-coated copper wire exhibits long-term high reliability as described above, can be judged based on whether or not the above-described palladium-concentrated region is observed by preparing a palladium-coated copper wire, forming a free air ball (FAB) by using the wire under the above-described conditions, for example, and analyzing a tip portion of the free air ball without performing first bonding. Specifically, if, when the prepared palladium-coated copper wire contains palladium and the sulfur group element at the above-described predetermined concentrations, and this wire is used to perform the analysis of FAB-attached wire, the palladium-concentrated region is observed at the tip portion of FAB, it can be judged that the prepared palladium-coated copper wire contains the sulfur group element in the palladium layer, and satisfies the configuration of the palladium-coated copper bonding wire of the present embodiment that exhibits long-term high reliability.

In the palladium-coated copper bonding wire of the present embodiment, the copper core material may contain palladium. When the palladium-coated copper bonding wire does not have another layer on the palladium layer and the copper core material contains palladium, the concentration of palladium in the entire wire is the total of the concentration of palladium derived from the palladium layer and the concentration of palladium derived from the copper core material. When another layer is not provided on the palladium layer, the concentration of palladium derived from the palladium layer relative to the total of copper, palladium, and the sulfur group element in the entire wire is preferably 1.0 to 2.5 mass %. When the palladium-coated copper bonding wire of the present embodiment has another layer on the palladium layer, it is possible to determine the concentration of palladium by setting palladium coming into another layer from the palladium layer through diffusion or the like, to palladium derived from the palladium layer.

The palladium (Pd)-coated copper bonding wire of the present embodiment has 1.0 mass % or more of the concentration of palladium and contains a predetermined amount of each of the sulfur group elements, thereby making it possible to enhance ball bonding reliability, resulting in that excellent ball bondability is maintained for a long period of time even under high-temperature and high-humidity. When the concentration of palladium is 4.0 mass % or less, in particular, the concentration of palladium derived from the palladium layer is 2.5 mass % or less, the occurrence of a shrinkage cavity in a free air ball (FAB) can be suppressed. As above, the concentration of palladium is 1.0 to 4.0 mass % and a predetermined amount of each of the sulfur group elements is contained, thereby making it possible to achieve both the high reliability of ball bonding and the suppression of occurrence of a shrinkage cavity during free air ball formation.

From the viewpoint of obtaining the high reliability of ball bonding, the concentration of palladium derived from the palladium layer is preferably 1.3 mass % or more. From the viewpoint of suppressing the occurrence of a shrinkage cavity, the concentration of palladium derived from the palladium layer is preferably 2.3 mass % or less.

The concentration of palladium derived from the palladium layer can be calculated by measuring the concentration of palladium in the entire wire and the concentration of palladium in the copper core material, respectively, and using these. Concretely, the analysis can be performed as follows by secondary ion mass spectrometry (SIMS). First, a wire to be measured is pressed and flattened. A SIMS spectrometer (for example, IMS-7f secondary ion mass spectrometer manufactured by CAMECA) is used to measure the concentration of palladium in a copper (Cu) core material of the flattened wire. A palladium layer of the surface of the above-described flattened wire is removed by sputtering in the above-described spectrometer to expose copper. To expose copper (Cu), for example, a wire with a diameter of 10 to 30 µm is sputtered for at least 0.5 µm or more in terms of palladium (Pd) from the surface to remove the palladium layer, and then is analyzed to a depth of 2.0 µm by starting the SIMS analysis. For example, 100 points or more are measured from an analysis start point up to an analysis end point (2.0 µm in depth) to calculate an average concentration of these 100 points. The analysis conditions are as follows: for example, primary ion species of $Cs^+$, a primary ion acceleration voltage of 15.0 keV, a primary ion irradiation region of about 30 µm×30 µm, and an analysis region of about 12 µm×12 µm as the setting conditions of the SIMS spectrometer. In the SIMS analysis, secondary ions released by sputtering while using the primary ions such as $Cs^+$ are detected with a mass spectrometer, and subjected to an elemental analysis. The concentration of palladium can be determined by converting a measured secondary ion intensity of palladium (Pd) to a concentration using a copper (Cu) wire whose concentration of palladium (Pd) has been already known as a standard sample.

The sulfur group elements are mainly contained in the palladium layer. However, the amount of the sulfur group elements is extremely small, and thus various analytical methods sometimes fail to accurately measure where the sulfur group elements are present and the concentration thereof in a configuration with an extremely thin palladium layer, in particular, currently. For this reason, the amount of the sulfur group elements is set to be in the above-described range as an amount relative to the entire palladium-coated copper bonding wire.

In crystal orientations <hkl> in a wire longitudinal direction at a crystal plane of a cross section of the palladium-coated copper bonding wire of the present embodiment, a ratio of <100> orientation (including an orientation with an angular difference relative to the wire longitudinal direction of up to within 15°) is 15% or more, and a ratio of <111> orientation (including an orientation with an angular difference relative to the wire longitudinal direction of up to within 15°) is 50% or less. This makes it possible to suppress a shape of a ball bonding (first bonding) portion from being a deformed shape such as an elliptical shape which is deviated from a perfect circle, and it is possible to make the shape of the ball bonding portion to be close to a perfect circle in a stable manner. When the circularity is good, it is advantageous for a reduction in diameter of a free air ball and a ball of the first bonding, and it becomes easy to perform manufacturing management in a bonding process. For example, when bonding a small-diameter ball regarding which a ratio of free air ball diameter/wire diameter is in a range of 1.5 to 1.7, the circularity of a ball bonding portion is stably improved. For this reason, even in narrow-pitch bonding with an electrode interval of 40 µm or less, for example, it becomes easy to maintain high reliability without causing short failure.

In addition, from a point of increasing the circularity of the ball bonding portion, in the crystal orientations <hkl> in the wire longitudinal direction at the crystal plane of the cross section of the wire, the <100> orientation ratio is preferably 30% or more, and the <111> orientation ratio is preferably 40% or less. Further, although an upper limit of the <100> orientation ratio and a lower limit of the <111> orientation ratio are not limited in particular, the <100> orientation ratio is preferably 85% or less, and the <111> orientation ratio is preferably 15% or more, from a point that the control of crystal orientations when manufacturing the palladium-coated copper bonding wire becomes relatively easy. Furthermore, the total of <111>+<100> orientation ratios is more preferably 30% or more, and still more preferably 90% or more. If this range is satisfied, it is possible to further improve the circularity of the bonding.

A ball bonding portion of a coated wire is likely to cause a deformed shape of bonding, when compared to a single-layer wire, but in a conventional bonding process with an interelectrode distance (pitch) exceeding approximately 60 µm, there has been no need to perform strict management. However, as the ball diameter becomes small, a shape of a ball bonding portion is likely to be deviated from a perfect circle to be a deformed shape, and as the pitch becomes narrow, short failure is likely to occur since the ball bonding portion is partially protruded from an electrode or the ball bonding portion is brought into contact with an adjacent electrode.

As a result of studying measures against the short failure caused by deterioration of circularity of the ball bonding portion in the narrow-pitch bonding, the present inventors have focused attention on crystal orientations at a crystal plane of a cross section of a wire, and examined deformation behavior of a free air ball during first bonding due to compressive deformation and application of ultrasonic waves. As a result of this, it has been found out that in a coated bonding wire, by controlling <111> and <100> crystal orientation ratios at a crystal plane of a cross section of the wire, it is possible to improve the circularity of a ball bonding portion and thus a deformed shape can be suppressed. In particular, with the use of the palladium-coated copper bonding wire having the above-described composition, it has been confirmed that even in a case where a small-diameter ball having a ratio of free air ball diameter/wire diameter of 1.5 to 1.7 is bonded, the circularity can be improved, and the short failure in the narrow-pitch bonding can be reduced.

The reasons thereof can be estimated as follows. When the palladium-coated copper bonding wire of the present embodiment is used, a palladium-concentrated region containing palladium at a predetermined concentration is formed in layers in the vicinity of a surface of a free air ball formed during first bonding. It can be considered that, in a quite short period of time during which a wire is melted by arc discharge, solidified to form a molten ball, and the molten ball is bonded, the palladium-concentrated region on the surface of the ball forms a structure with a uniform inner structure, resulting in that deformation due to a load of a bonder apparatus or application of ultrasonic waves is homogenized more. This can be considered to improve the circularity even in first bonding with narrow pitch.

For measurement of a crystal structure at a crystal plane of a cross section of a wire, an Electron Back Scattering Pattern (which will be referred to as "EBSP", hereinafter) method can be used. By the measurement of a texture according to the EBSP method, it is possible to measure a texture of a cross section of even a thin wire such as a bonding wire accurately and with sufficient reproducibility.

When measuring crystal orientations of a cross section of a wire, the measurement can be performed at each of a cross section vertical to a wire longitudinal direction, and a parallel cross section parallel to the wire longitudinal direction and positioned in the vicinity of the center of the wire. In the EBSP method, normally, when a sample has large projections and recesses or a large curved surface, it becomes difficult to measure the crystal orientations with high accuracy. Accordingly, in order to observe a cross section of the wire by the EBSP, it is useful to perform smoothing processing on a surface of the cross section. As methods of performing smoothing processing on the surface of the cross section, there can be cited mechanical polishing, chemical polishing, a FIB machining method, and so on. According to these methods, it is possible to obtain a smooth surface by removing a residual strain on the surface of the cross section. Further, for the measurement of crystal orientations, it is preferable to use the cross section vertical to the wire longitudinal direction since it is easy to obtain a smooth cross section.

When the preprocessing of the sample is properly performed as described above, the crystal orientations of the cross section of the wire can be measured and analyzed by the EBSP method with high accuracy. The measurement of crystal orientations is performed at three or more of different places, thereby making it possible to obtain average information which takes variations into consideration.

Further, in the EBSP method, standard data (standard pattern file) of a material whose composition is similar to that of a structure to be measured is used. However, in the palladium-coated copper bonding wire of the present embodiment, the concentration of sulfur group elements in the entire wire, the concentration of palladium, and the concentration of trace elements in copper are extremely small, so that when measuring the crystal structure of the cross section of the wire by using the EBSP method, data of pure copper may also be used as the standard data.

Next, the other configurations of the palladium-coated copper bonding wire of the present embodiment will be described. A diameter of the palladium-coated copper bonding wire of the present embodiment is normally 10 to 30 μm, and is preferably 25 μm or less. The smaller the diameter of the palladium-coated copper bonding wire, the more suitable it is for narrow-pitch bonding.

The core material in the palladium-coated copper bonding wire of the present embodiment is copper or a copper alloy made of copper as a main component. The main component here means that the component is central in quantity or properties, and the content is at least 50.0 mass %. The properties as the main component are properties required for the configuration, which are, for example, mechanical properties such as a wire breaking force and an elongation percentage in the case of the copper core material. The main component can be said to be, for example, a component that centrally affects such properties.

In addition to copper (Cu), the copper core material may also contain trace elements such as inevitable impurities and additive elements. The additive elements are elements to be added in trace amounts for the purpose of improving properties such as oxidation resistance and toughness of the palladium-coated copper bonding wire, and the like generally. Such trace elements are, for example, phosphorus (P), gold (Au), platinum (Pt), Pd (palladium), nickel (Ni), silver (Ag), rhodium (Rh), indium (In), gallium (Ga), iron (Fe), and so on. When the copper core material contains the trace elements, it is possible to further improve the reliability of the first bonding, and improve the circularity of the ball bonding portion of the first bonding. The reason thereof can be considered as follows: the core material containing the aforementioned trace elements that contribute to the high reliability of the first bonding becomes moderately harder than pure copper, so that the hardness of a free air ball becomes slightly larger than that when using pure copper, and the free air ball is more uniformly deformed by a crimping load and application of ultrasonic waves during the first bonding, resulting in that the circularity of the ball bonding portion can be improved. The improvement of circularity of the ball bonding portion makes it possible to suppress short failure in the narrow-pitch bonding. When the copper core material contains the trace elements, a total amount thereof is preferably 1 mass ppm or more relative to the entire core material. A ratio of the trace elements is preferably 3.0 mass % or less, and if this range is satisfied, the bonding reliability is obtained, an increase in cost is suppressed as well, and in addition to that, good wire drawability can be maintained and it is possible to suppress an increase in resistivity of the wire. Further, chip damage becomes difficult to occur during the ball bonding. The ratio of the trace elements is more preferably 2.0 mass % or less, and still more preferably 1.5 mass % or less.

Concretely, when the copper core material contains one or more selected from Au, Pt, Pd, Ni, and Rh as the trace elements, a content ratio thereof is preferably 0.05 mass % or more and 3.0 mass % or less in total relative to the entire core material, more preferably 0.1 mass % or more and 2.0 mass % or less, and still more preferably 0.2 mass % or more and 1.0 mass % or less. Further, when the copper core material contains Ni out of Au, Pt, Pd, Ni, and Rh as the trace element, a content ratio of Ni is preferably 0.1 mass % or more and 2.0 mass % or less relative to the entire core material, and more preferably 0.3 mass % or more and 1.0 mass % or less.

When the copper core material contains one or more of In and Ga as the trace elements, a total amount thereof is preferably 0.01 mass % or more and 0.7 mass % or less, more preferably 0.05 mass % or more and 0.6 mass % or less, and still more preferably 0.1 mass % or more and 0.5 mass % or less. When the copper core material contains P as the trace element, an amount thereof is preferably 5 mass ppm or more and 500 mass ppm or less, more preferably 20 mass ppm or more and 400 mass ppm or less, and still more preferably 50 mass ppm or more and 250 mass ppm or less. When the copper core material contains one or more of Ag and Fe as the trace elements, a total amount thereof is preferably 1 mass ppm or more and 100 mass ppm or less, more preferably 3 mass ppm or more and 60 mass ppm or less, and still more preferably 5 mass ppm or more and 30 mass ppm or less.

The content ratios of the trace elements in copper and elements to be contained in the wire are generally measured by a chemical analysis such as an inductively coupled plasma (ICP) emission spectrochemical analysis, but the measurement is not limited thereto. For example, the content ratio of a metallic element in the copper core material can be measured by the SIMS analysis in the same manner as palladium in the above-described copper core material.

The palladium layer can be analyzed as a region ranging from where the ratio of palladium is 50.0 atom % relative to the total of copper and palladium to the surface of the palladium layer in the Auger (FE-AES) analysis profile in the depth direction from the surface of the wire. Where the ratio of palladium is 50.0 atom % is the boundary between the copper core material and the palladium layer. In the case where the palladium layer is so thin that it is difficult to clearly measure the thickness of the palladium layer or the existing ratio of palladium in a specific place even by the FE-AES analysis, the FE-AES analysis may be further combined with an analysis by transmission electron microscopy/energy dispersive X-ray spectrometry (TEM/EDX), an analysis by spherical aberration-corrected transmission electron microscopy/energy dispersive X-ray spectrometry (STEM/EDX), an atomic number contrast image (HAADF image), or the like appropriately.

The thickness of the palladium layer is preferably, depending on the diameter of the palladium-coated copper bonding wire, 0.020 μm or more and 0.150 μm or less, and more preferably 0.030 μm or more and 0.130 μm or less when the diameter of the wire is 10 to 30 μm. This is because when the thickness of the palladium layer is uniform within the above-described range, leaning resistance when the bonding wire is bonded and the quality of loop characteristics such as stability of a loop height are improved. As a method of measuring the thickness of the palladium layer, the above-described FE-AES analysis can be used, and as described above, in order to improve the measurement accuracy, the analysis by TEM/EDX, the analysis by STEM/EDX, the HAADF image, or the like may be used in combination appropriately.

The palladium-coated copper bonding wire of the present embodiment contains the sulfur group element (one or more of sulfur, selenium, and tellurium), and when containing two or more of the sulfur group elements, the total concentration of the sulfur group elements in the entire wire is 50.0 mass ppm or less. The total concentration of the sulfur group element in the entire wire is preferably 5.0 mass ppm or more, which makes it easy to obtain ball bonding reliability. From the viewpoint of ball bonding reliability, the total concentration of the sulfur group element in the entire wire is preferably 6.0 mass ppm or more. Further, when the concentration of the sulfur group element exceeds 50.0 mass ppm, the palladium layer becomes brittle, cracks occur in the palladium layer during wire drawing, and the cracks cause the wire to break, resulting in poor wire drawability. In order to improve the wire drawability, the concentration of the sulfur group element is preferably 45.0 mass ppm or less, and more preferably 41.0 mass ppm or less.

In the palladium-coated copper bonding wire of the present embodiment, among the above-described sulfur group elements, the concentration of sulfur (S) is 5.0 mass ppm or more in the entire wire, and preferably 6.0 mass ppm or more. The concentration of sulfur (S) is 5.0 mass ppm or more, which makes it possible to enhance the ball bonding reliability. On the other hand, the concentration of sulfur (S) is 12.0 mass ppm or less in the entire wire, and when the concentration exceeds this, the palladium layer becomes brittle, cracks occur in the palladium layer, and the cracks cause the wire to break, resulting in poor wire drawability. The concentration of sulfur (S) is preferably 10.0 mass ppm or less in the entire wire.

Further, the concentration of selenium (Se) is 5.0 mass ppm or more in the entire wire, preferably 6.0 mass ppm or more, and more preferably 8.0 mass ppm or more. The concentration of selenium (Se) is 5.0 mass ppm or more, which makes it possible to enhance the ball bonding reliability. On the other hand, the concentration of selenium (Se) is 20.0 mass ppm or less in the entire wire, and when the concentration exceeds this, the palladium layer becomes brittle, cracks occur in the palladium layer, and the cracks cause the wire to break, resulting in poor wire drawability. The concentration of selenium (Se) is preferably 15.0 mass ppm or less in the entire wire.

Further, the concentration of tellurium (Te) is 15.0 mass ppm or more in the entire wire, and more preferably 16.0 mass ppm or more. The concentration of tellurium (Te) is 15.0 mass ppm or more, which makes it possible to enhance the ball bonding reliability. On the other hand, the concentration of tellurium (Te) is preferably 50.0 mass ppm or less in the entire wire, and when the concentration exceeds this, the palladium layer becomes brittle, cracks occur in the palladium layer, and the cracks cause the wire to break, resulting in poor wire drawability. The concentration of tellurium (Te) is preferably 45.0 mass ppm or less in the entire wire, and more preferably 41.0 mass ppm or less.

The palladium-coated copper bonding wire used in the present embodiment may contain only one of the sulfur group elements or two or more of them, as long as the total concentration of the sulfur group element is within a range of 50 mass ppm or less and one of sulfur, selenium, and tellurium satisfies the above-described concentration range. As described above, since the palladium-coated copper bonding wire contains each of the sulfur group elements at the above-described concentration, it has a property such that the palladium-concentrated region is formed on the surface of the tip portion of the free air ball, and the aforementioned palladium-concentrated bonding region is easily formed in the ball bonding portion in a stable manner without depending on the ball forming conditions, resulting in that the bonding reliability can be improved significantly.

The palladium-coated copper bonding wire of the present embodiment may include a second layer made of metal other than palladium on the palladium layer. The metal of the second layer may be a pure metal, or an alloy of two or more metals mixed together. When the palladium-coated copper bonding wire includes the second layer on the palladium layer, the boundary between the palladium layer and the second layer can be measured as a portion where the concentration of the main component metal in the second layer is 50.0% relative to the maximum concentration. In the case of including a third layer and a fourth layer on the surface of the second layer, the analysis can be performed according to the above.

The palladium-coated copper bonding wire of the present embodiment preferably includes a gold layer in the outermost layer as a layer other than the palladium layer. The palladium-coated copper wire of the present embodiment includes the gold layer, thereby making it possible to improve bondability of the second bonding and reduce die wear during wire drawing simultaneously. The gold layer is a layer formed of gold as its main component. The gold layer may be partially interrupted as long as it is formed over the surface of the palladium layer, and palladium may be contained in the gold layer. When palladium is contained in the gold layer, the concentration of palladium may be uniform in the thickness direction or may have a concentration gradient that decays toward the surface. Further, when the gold layer is formed of an alloy of two or more metals mixed together, the gold layer may contain silver, copper, and so on in addition to palladium and gold as long as the effect of the present invention is not impaired. In this case, the amount of metal elements other than palladium in the gold layer is, for example, less than 50.0 mass %.

When the palladium-coated copper bonding wire of the present embodiment includes the gold layer, the concentration of gold derived from this gold layer in the entire wire is preferably 0.01 mass % or more, and more preferably 0.05 mass % or more. When the concentration of gold derived from the gold layer is 0.01 mass % or more, the second bondability tends to improve and the die wear during wire drawing is reduced easily. The concentration of gold derived from the gold layer in the entire wire is preferably 0.20 mass % or less, and more preferably 0.15 mass % or less. When the concentration of gold derived from the gold layer is 0.20 mass % or less, it is less likely to adversely affect the wire performance and less likely to impair the sphericity of the free air ball. Note that when the copper core material contains gold, the concentration of gold in the entire wire is the total of the concentration of gold derived from the above-described gold layer and the concentration of gold in the copper core material. Therefore, when measuring the concentration of gold derived from the gold layer, the concentration of gold in the entire wire and the concentration of gold in the copper core material can be measured respectively, to calculate the concentration of gold derived from the gold layer using these concentrations. The concentration of gold derived from the gold layer can be measured by the SIMS analysis concretely in the same manner as the concentration of palladium derived from the above-described palladium layer.

The thickness of the gold layer is preferably, depending on the diameter of the palladium-coated copper bonding wire, 8 nm or less, and more preferably 5 nm or less. When the thickness of the gold layer is 8 nm or less, it is easy to maintain high reliability of the ball bonding without impairing the sphericity of the free air ball even with the gold layer. A lower limit of the thickness of the gold layer is not particularly limited, but it is sufficient as long as a later-described concentration-converted average film thickness is 1 nm or more. As a method of measuring the thickness of the gold layer, the FE-AES analysis can be used as in the case of the palladium layer.

The thickness of the gold layer becomes significantly thin when the concentration of gold in the entire wire is in the above-described preferred range. When the thickness of the gold layer becomes significantly thin as above, it is currently difficult to accurately measure the thickness of the gold layer by using general measurement methods. Therefore, when the thickness of the gold layer becomes significantly thin, the thickness of the gold layer can be evaluated by the concentration-converted average film thickness, which is calculated using the concentration of gold in the entire wire and the diameter of the wire. Examples of a method of obtaining this concentration-converted average film thickness include: a method of calculating the mass of gold per unit length based on the concentration of gold and the specific gravity of gold, and then determining the film thickness by assuming that the cross section of the wire is a perfect circle and gold is uniformly present on the uppermost surface; and a method of performing a proportional calculation using a thickness of a gold coating at a plated wire diameter (which may be a design value), and a final wire diameter.

(Free Air Ball (FAB) Analysis)

Next, a free air ball analysis will be described. As described above, when the palladium-coated copper bonding wire of the present embodiment is subjected to the analysis of FAB-attached wire (namely, when forming the free air ball by using the palladium-coated copper bonding wire of the embodiment, and analyzing a tip portion of the free air ball without performing first bonding), the palladium-concentrated region containing palladium of 6.5 to 30.0 atom % relative to the total of copper and palladium, is observed in a range from a surface of the tip portion of the free air ball to 5.0 nm or more and 100.0 nm or less in the depth direction. Since the palladium-coated copper bonding wire of the present embodiment contains palladium and the sulfur group element at the specific concentrations of the present embodiment, the palladium-concentrated region is stably formed in the vicinity of the surface of the tip portion of the free air ball, resulting in that the occurrence of problematic large shrinkage cavity that inhibits the long-term maintenance of the bonding reliability of the first bonding, can be suppressed.

The free air ball forming conditions in the analysis of FAB-attached wire are the same as conditions to be normally employed in the first bonding. Concretely, for example, when the diameter of the palladium-coated copper bonding wire is 10 to 30 μm, arc discharge conditions are set so that a discharge current value is 30 to 90 mA, and the diameter of the free air ball is more than 1.7 times and 2.3 times or less the diameter of the wire. For a bonder apparatus, a commercially-available product such as a bonder apparatus (fully automatic Cu wire bonder; IConn ProCu PLUS) manufactured by KANDS Co., Ltd., for example, can be used. When using such a bonder apparatus, the apparatus is preferably set that a discharge time is 50 to 1000 μs, an EFO-Gap is 25 to 45 mil (about 635 to 1143 μm), and a tail length is 6 to 12 mil (about 152 to 305 μm). When another bonder apparatus other than this bonder apparatus is used, the conditions only need to be the same as above, which are, for example, the condition under which the diameter of the free air ball becomes the same size as above. Further, in order to make a mixed gas atmosphere of nitrogen and hydrogen or a nitrogen gas atmosphere for the tip portion of the wire, the above-described gas is sprayed at a gas flow rate of 0.2 to 0.8 L/minute, and preferably 0.3 to 0.6 L/minute. The gas when forming the free air ball is preferably a mixed gas of 95.0 vol % of nitrogen and 5.0 vol % of hydrogen, and the diameter of the free air ball may be within the above-described range as the target value.

When observing whether or not the palladium-concentrated region is formed for a predetermined wire, the above-described concentrated region may be measured using a free air ball formed in the presence of a mixed gas of nitrogen and hydrogen, with the discharge current value of 65 mA and the ball diameter of 1.8 times the diameter of the wire in the above-described range representatively. The ball diameter is a target value or an actual measured value, but is preferably the actual measured value. Further, as a normally supposed error range, the diameter of the free air ball during the analysis may also be in a range of 1.8±0.05 times the diameter of the wire.

When the palladium-coated copper bonding wire of the present embodiment is used to form a free air ball, most of the palladium remains in the vicinity of the surface without being diffusively absorbed into the inside of the ball during ball melting. The palladium remaining in the vicinity of the surface forms a palladium-concentrated region on the surface of the solidified ball. Therefore, the palladium-concentrated region has the above-described composition as traces of the palladium remaining in the vicinity of the surface of the free air ball before solidification. When the palladium-concentrated region is observed at the surface of the tip portion of the free air ball, it can be presumed that the palladium-concentrated region, which is in a palladium-rich state, is formed in layers in the entire vicinity of the surface of the ball or in a partial range including the tip portion. When bonding to an aluminum electrode, the presence of the palladium-concentrated region at the place of the free air ball where the free air ball and the electrode are bonded, can improve the bonding reliability of the ball bonding (first bonding).

According to the palladium-coated copper bonding wire, which is configured to form the palladium-concentrated region when performing the free air ball analysis, it is possible to prevent a shrinkage cavity during free air ball formation. Further, since the palladium-coated copper bonding wire is ball-bonded to the electrode of aluminum or the like via the free air ball having the palladium-concentrated region as described above, it is possible to extremely increase the ball bonding reliability.

The palladium contained in the palladium-concentrated region may be derived from the core material, the palladium layer, or both. The formation of such a palladium-concentrated region makes it possible to obtain excellent effects such that the bonding reliability of the ball bonding is improved and the occurrence of a shrinkage cavity in the free air ball can be suppressed simultaneously. Concretely, according to the palladium-coated copper bonding wire of the present embodiment, excellent bonding reliability can be maintained for a long period of time even in high-temperature and high-humidity environments. The concentration of palladium in the palladium-concentrated region is preferably 7.0 to 25.0 atom %. If this range is satisfied, chip damage can be further suppressed to improve the yield of a semiconductor device. The palladium-concentrated region can be observed by an Auger (FE-AES) analysis, as will be described later.

In the palladium-coated copper bonding wire of the present embodiment, typically, the sulfur group element is contained at the above-described specific amount in the palladium layer, and thereby the palladium-concentrated region can be formed.

The typical measurement conditions in the case of measuring the palladium-concentrated region by the FE-AES analysis are as follows: in wires with a diameter of 10 to 30 µm, preferably 15 to 25 µm, and more preferably 18 to 20 µm, the FE-AES electron spectrometer is used to analyze a tip portion of a free air ball from the surface to 100.0 nm in the depth direction. The measurement conditions at this time are as follows: for example, an acceleration voltage of a primary electron beam of 10 kV, a current of 50 nA or less (preferably 50 nA), an acceleration voltage of argon ion sputtering of 1 kV, and a sputtering rate of 2.5 nm/minute (in terms of $SiO_2$) as the settings of the FE-AES electron spectrometer. The area of a measurement region calculated from a set value is 15 $\mu m^2$ or more and 20 $\mu m^2$ or less, and is set to a substantially circular shape or a substantially square shape, for example. Concretely, as the measurement region, a substantially circular shape having a diameter of 5 µm or a substantially square shape of 4 µm×4 µm can be used. Note that an analysis region, which is a set value, is preferably a region that has the above-described area and has a smaller outer peripheral length, for example, a square or a circle. More concretely, a more appropriate analysis is possible by adjusting the maximum distance from the center of gravity of a plane figure formed by at least an outer peripheral line of the analysis region to the outer peripheral line to be 3 µm or less. In order to improve the analytical accuracy, the Auger analysis is performed at nine or more points at even intervals in the depth direction, and an average value of the analysis is calculated. Further, the measurement region can be evaluated as a region assuming that the beam is emitted vertically to a predetermined plane, without considering the inclination of the sample.

The palladium-concentrated region can be measured as a region including a range of depth with 6.5 to 30.0 atom % of palladium relative to the total of copper and palladium in respective depths of the FE-AES profile from the surface to 5.0 to 100.0 nm in depth. At this time, depending on the measurement location, the region with 6.5 to 30.0 atom % of palladium may be discontinuous, but in such a case, a range including all the regions with 6.5 to 30.0 atom % of palladium can be identified as the palladium-concentrated region. Note that the FE-AES profile may contain noise due to extraneous matters or the like, and thus the measurement is performed from a place with a depth of 5.0 nm from the surface toward the center.

It is normal that, in the case of using the palladium-coated copper bonding wire of the present embodiment described above, the concentration of palladium of the palladium-concentrated region of the free air ball is substantially constant in the depth direction from the surface, or the palladium-concentrated region is formed so that the concentration of palladium decreases gradually. Therefore, as the palladium-concentrated region, a range of 5 nm or more and 300 nm or less is preferable, and a range of 400 nm or less is more preferable. That is, a palladium-concentrated region having the above-described specific concentration as the average concentration of palladium, which is within the preferred thickness range from the surface, is preferably observed. This is because the thicker the palladium-concentrated region, the easier it is to obtain the effect of improving bonding reliability. On the other hand, the thickness of the palladium-concentrated region is thought to be about 1.5 µm or less and preferably suppressed to 1.0 µm or less, when the diameter of the wire is 10 to 30 µm, because the concentration of palladium in the entire wire is the above-described specific concentration. Since the palladium-concentrated region is suppressed to the above-described thickness, it is less likely to damage a semiconductor chip.

(Wire Bonding Structure)

Next, a wire bonding structure produced by using the palladium-coated copper bonding wire of the present embodiment, and a bonding structure analysis will be described. FIG. 1 is a schematic sectional view illustrating one example of a wire bonding structure 10 of the present embodiment. The wire bonding structure 10 illustrated in FIG. 1 is formed by making a palladium-coated copper bonding wire to be ball-bonded to a surface of an aluminum-containing electrode 52 on a silicon (Si) substrate 51. FIG. 1 represents a cross section of this wire bonding structure 10, cut at a plane passing through a center line L in a wire longitudinal direction of the palladium-coated copper bonding wire and parallel to the center line L. The wire bonding structure 10 includes a ball bonding portion 20, a bonding surface 21, and a wire portion 22 formed of the above-described palladium-coated copper bonding wire. A wire diameter φ of the wire portion 22 is equal to a diameter of the palladium-coated copper bonding wire.

The ball bonding portion 20 is formed of a first ball compressed portion 20a on its upper side and a second ball compressed portion 20b on its lower side. When performing ball bonding, a free air ball formed at a tip of the palladium-coated copper bonding wire is pressure-bonded onto the electrode 52. The first ball compressed portion 20a is a portion which relatively maintains a shape of the free air ball before being subjected to ball bonding, and the second ball compressed portion 20b is a portion formed by the free air ball being crushed and deformed. Further, a surface 23 is a surface of the second ball compressed portion 20b. In the drawing, $X_0$ is a maximum width of the second ball compressed portion 20b in a direction parallel to the bonding surface 21 (a direction vertical to the center line L of the wire), and Y is a maximum height of the second ball compressed portion 20b from the bonding surface 21. $P_1$, $P_2$ are line analysis portions, which pass through, out of points obtained by dividing the maximum width $X_0$ of the second ball compressed portion 20b in the direction parallel to the bonding surface 21 into eight equal parts, outer-side points (points close to respective ends) and are positioned in a direction vertical to the bonding surface 21 (a direction parallel to the center line L of the wire). Note that when the bonding surface 21 is difficult to be specified, there is no problem if the measurement is performed with the maximum width of the second ball compressed portion 20b in a direction vertical to the center line L of the wire, since $X_0$ in that case also takes an equivalent value. Y may also be calculated by a maximum height based on a contact point between the free air ball and the electrode 52. Note that regarding a size, a direction, and so on of the respective portions in the ball bonding portion 20, a range of error of measurement or the like is allowed as a matter of course.

The wire bonding structure 10 of the present embodiment includes, in the vicinity of the bonding surface 21 on the electrode 52, a palladium-concentrated bonding region having a concentration of palladium of 2.0 mass % or more, preferably 5.0 mass % relative to the total of aluminum, copper, and palladium.

The palladium-concentrated bonding region can be evaluated as a predetermined range in which a mass ratio of palladium relative to the total of palladium, copper, and aluminum is 2.0 mass % or more, preferably 5.0 mass % or more, in the vicinity of the bonding surface where the free air ball and the electrode are brought into contact with each other to be bonded, namely, a region where aluminum and palladium coexist. Concretely, a predetermined place at a cross section of the above-described ball bonding portion 20 is subjected to a line analysis from the ball bonding portion 20 side toward the bonding surface 21 in a direction parallel to the center line of the wire, with the use of a field-emission scanning electron microscopy/energy dispersive X-ray spectrometry (FE-SEM/EDX). At this time, a predetermined range where the mass ratio of palladium relative to the total of palladium, copper, and aluminum is 2.0 mass % or more, preferably 5.0 mass % or more, at each measurement point in the range where aluminum is greater than 0.5 mass % and 95.0 mass % or less, can be evaluated as the palladium-concentrated bonding region. Here, the reason why the measurement is performed in the range where the concentration of aluminum is greater than 0.5 mass % and 95.0 mass % or less is because an analytical value of the place with no presence of aluminum is not 0 mass % due to effects of noise, and so on in analysis, or an analytical value of the place with the presence of only aluminum is not 100.0 mass % in some cases.

Having the palladium-concentrated bonding region with such a composition makes it possible to inhibit corrosion of a ball bonding portion, prevent breaks and separation, and improve bonding reliability. The electrode is formed, for example, by coating a surface of a silicon (Si) base material with an electrode material such as Al, AlSiCu (for example, Al—Cu (0.2 to 0.9 mass %)-Si (0.5 to 1.5 mass %)), or AlCu (for example, Al—Cu (0.2 to 0.9 mass %)). Further, the temperature of the electrode during ball bonding is 140 to 200° C., for example.

The concentration of palladium in the palladium-concentrated bonding region is preferably high, and is 50.0 mass % or less, normally 30.0 mass % or less, or 20 mass % or less at each measurement point of the line analysis of the FE-SEM/EDX, for example.

Here, for example, if a wire with a diameter of 10 to 30 μm has a range of 50 nm or more in which the concentration of palladium is 2.0 mass % or more when the total of aluminum, palladium, and copper is set to 100 mass % in a concentration profile of the FE-SEM/EDX analysis, for example, in the above-described line analysis, it can be evaluated that there exists the palladium-concentrated bonding region.

The effect provided by having the palladium-concentrated bonding region within the bonding surface 21, can also be evaluated by a concentration analysis at the above-described line analysis portions ($P_1$, $P_2$). Specifically, in FIG. 1, straight lines in a direction vertical to the bonding surface 21, which pass through, out of points obtained by dividing the maximum width $X_0$ of the second ball compressed portion 20b in a direction substantially parallel to the bonding surface into eight equal parts, outer-side points (respective points close to ends) are set to the line analysis portions $P_1$, $P_2$ at two places, and are respectively subjected to the line analysis from the ball side toward the electrode side by the FE-SEM/EDX, in the same manner as above. At this time, if the palladium-concentrated bonding region in which the concentration of palladium is 2 mass % or more relative to the total of aluminum, copper, and palladium is detected in each of the line analysis portions $P_1$, $P_2$, it can be regarded that the palladium-concentrated bonding region exists in the vicinity of the bonding surface 21. Consequently, it is possible to evaluate that the bonding reliability is maintained for a long period of time. Halogen elements and moisture from an encapsulating resin and the like are highly likely to penetrate from both ends in the vicinity of the ball bonding surface, namely, small gaps or the like in the vicinity of edges of the bonding portion between the ball and the electrode. Accordingly, the presence of palladium-concentrated bonding region with high corrosion resistance in the vicinity of both ends plays a very important role in terms of prevention of penetration of halogen and so on.

An occupancy ratio of the palladium-concentrated bonding region in the vicinity of the bonding surface 21 between the electrode and the free air ball in the wire bonding structure is preferably 25% or more. This makes it possible to maintain excellent high reliability. The occupancy ratio of the palladium-concentrated bonding region within the bonding surface is more preferably 50% or more, and still more preferably 75% or more.

The occupancy ratio of the palladium-concentrated bonding region within the bonding surface 21 can be calculated as follows, as a ratio of a width of the palladium-concentrated bonding region in a direction of the bonding surface 21 to the maximum width ($X_0$ illustrated in FIG. 1) of the boll bonding portion at a cut surface. A cut surface as illustrated in FIG. 1 is formed by the same method as above, and then this cut surface is observed through a surface analysis of electron probe microanalyzer (EPMA) (with an acceleration voltage of 15 kV and an irradiation current of 290 nA, for example). In this observation image, a part at which a higher concentration of palladium is detected compared to a place where the concentration of palladium is 2.0 mass % or more relative to the total of aluminum, copper, and palladium, as intensity of palladium (Pd), is regarded to reflect the palladium-concentrated bonding region, and the total $X_1$ of widths of the parts with high intensity is measured. This width $X_1$ is measured as a width in a direction vertical to the center line L of the wire. The maximum width $X_0$ of the second ball compressed portion 20b at the cut surface and the total of the widths of the ranges where the palladium-concentrated bonding region is detected (total width $X_1$) are measured, and the occupancy ratio is calculated as $(X_1/X_0) \times 100(\%)$. Note that regarding curved portions of the second ball compressed portion 20b, which are not directly bonded to the electrode on the electrode side (lower side in FIG. 1), a width as a result of projecting the curved portions onto the maximum width $X_0$ is measured, thereby making it possible to calculate the occupancy ratio of the palladium-concentrated bonding region.

Generally, in the EPMA measurement (surface analysis), for example, a presence ratio of an element to be measured is normally measured as intensity of X-ray emitted from the element when the element to be measured is irradiated with electron beam, and is displayed by a color mapping image in which the intensity is reflected on color. Specifically, in the color mapping image, a point where the element to be measured does not exist is displayed by intense black, and elements are displayed by gradation of "white, red, yellow, green, blue, black" or the like, as an example, in descending order of the presence ratio of the element. If, in the vicinity of the bonding surface 21 on such a color mapping image of EPMA, the concentration of palladium at a point with the smallest intensity of palladium (a place which is not expressed by intense black but is darkest among places where the intensity of palladium is observed on the color mapping image, for example, a place expressed by blue close to black in the above-described gradation) is 2.0 mass % or more, a region expressed by color of higher intensity can be specified as the palladium-concentrated bonding region. Further, the results of the line analysis and the color mapping image of EPMA (surface analysis) are overlaid, and the points where 2.0 mass % or more of the concentration of palladium is observed in the line analysis and the intensity is equal to or more than that of the measurement point on the color mapping image, are set to be able to be identified as the intensity difference (color on the image), or visually determined. Accordingly, it is possible to calculate the presence/absence and the occupancy ratio of the palladium-concentrated bonding region.

When the occupancy ratio of the palladium-concentrated bonding region is calculated by using the color mapping image of EPMA, the more the color mapping image is enlarged, the more the palladium-concentrated bonding region seems to be in a "sparse" state in some cases. Accordingly, it is preferable to calculate the occupancy ratio at a magnification that allows at least the second ball compressed portion of the ball bonding portion to fit into a single image. Further, even if there is a state where palladium is "sparse" in the palladium-concentrated bonding region on the image or there is a black place in the bonding portion on the EPMA image, due to the enlargement of the color mapping image or the like, this place may be regarded as the palladium-concentrated bonding region as long as the concentration of palladium is detected to be 2.0 mass % or more in the result of line analysis at this place.

By forming the palladium-concentrated bonding region of the embodiment, it is possible to inhibit corrosion of the ball bonding portion, prevent breaks and separation of the ball bonding portion due to long-term use, and improve bonding reliability. In addition, the palladium-coated copper bonding wire contains the respective sulfur group elements at the above-described predetermined concentrations, so that even in a case where any condition is employed within a range of ball bonding condition such as one to be described later, it is possible to stably form the palladium-concentrated bonding region. For this reason, there is provided a significant effect of improving the bonding reliability when compared to the prior art in which, for example, if the ball forming conditions are manipulated, the concentration of palladium as described above of the ball bonding portion can be realized.

Further, as attributes of the palladium-coated copper bonding wire of the present embodiment, it is possible to check the palladium-concentrated bonding region in the wire bonding structure. Specifically, a prepared palladium-coated copper wire is used to produce a bonding structure, and when the bonding structure is observed to have the palladium-concentrated bonding region as described above, it is possible to judge that the prepared palladium-coated copper wire contains the sulfur group element in a palladium layer, and it satisfies the configuration of the palladium-coated copper bonding wire of the present embodiment which exhibits the long-term high reliability.

An analysis method when performing an analysis of the bonding structure using the palladium-coated copper wire will be explained in detail using, as an example, the case where a pure aluminum electrode is employed as a bonding target. The same applies to the case where an electrode containing aluminum and an element other than aluminum is used. The palladium-coated copper bonding wire is used to form a free air ball, and the ball is bonded onto the aluminum electrode. The ball bonding portion is cut so that a surface parallel to the center line L in the wire longitudinal direction is exposed. Accordingly, a cut surface as illustrated in FIG. 1 is obtained. The cut surface is subjected to a line analysis from a predetermined point on the wire side in a direction substantially vertical to the bonding surface 21 (depth direction). As the line analysis, the above-described FE-SEM/EDX is suitable. Note that the cut surface related to the analysis is preferably formed so as to include the center line L in the wire longitudinal direction or so as to be as close as possible to the center line L.

The free air ball can be formed based on conditions similar to those of the analysis of the FAB-attached wire. When the diameter of the palladium-coated bonding wire is 10 to 30 µm, preferably 15 to 25 µm, and more preferably 18 to 20 µm, arc discharge conditions are set so that a discharge current value is 30 to 90 mA, and the diameter of the free air ball is more than 1.7 times and 2.3 times or less the diameter of the wire. For a bonder apparatus, a commercially-available product such as a bonder apparatus (IConn ProCu PLUS) manufactured by KANDS Co., Ltd., for example, can be used. When using such a bonder apparatus, the apparatus is preferably set that a discharge time is 50 to 1000 µs, an EFO-Gap is 25 to 45 mil (about 635 to 1143 µm), and a tail length is 6 to 12 mil (about 152 to 305 µm). When another bonder apparatus other than this bonder apparatus is used, the setting conditions of the apparatus only need to be adjusted according to a target ball diameter, to thereby obtain the same ball diameter as above. Further, in order to make a mixed gas atmosphere of nitrogen and hydrogen or a nitrogen gas atmosphere for the tip portion of the wire, the above-described gas is sprayed at a gas flow rate of 0.2 to 0.8 L/minute, preferably 0.3 to 0.6 L/minute, and more preferably 0.5 L/minute. The gas when forming the free air ball is preferably a mixed gas of 95.0 vol % of nitrogen and 5.0 vol % of hydrogen, and the diameter of the free air ball is preferably set to fall within the above-described range as the target value.

Further, the ball bonding conditions (the first bonding conditions) can be adjusted by the bonder apparatus so that, regarding a wire whose diameter $\phi$ is 18 μm and on which a free air ball with a diameter of 32 μm is formed, for example, the height Y of the second ball compressed portion 20b becomes approximately 10 μm, and the maximum width $X_0$ of the second ball compressed portion 20b in a direction substantially parallel to the bonding surface 21 becomes approximately 40 μm. Concretely, a ball crimping force is 7.5 gf, an ultrasonic application output is 70 mA, a ball crimping time is 15 ms, a crimping temperature is 150° C., and so on, as settings of the bonder apparatus. Further, the second bonding conditions include, for example, in a scrubbing mode, a crimping force of 70 gf, a crimping time of 20 ms, a crimping temperature of 150° C., a frequency of 200 kHz, an amplitude of 3.0 μm, and 2 cycles. Note that the bonding can be performed with a loop length of 2.0 mm from the first bonding portion to the second bonding portion.

In an analysis test of the ball bonding portion, a cut surface can be formed in the following manner. A PBGA32PIN frame, for example, is used as a lead frame, and a semiconductor chip of substantially square shape is bonded to a center portion of this frame. An aluminum electrode on the semiconductor chip and an external electrode on the frame are bonded by the palladium-coated copper bonding wire, to thereby produce a measurement sample. The palladium-coated copper bonding wire is subjected to ball bonding (first bonding) to this aluminum electrode positioned on the semiconductor chip, and subjected to wedge bonding (second bonding) to the lead frame. Normally, a lot of electrodes are arranged in plural lines on a chip, so that, for example, to the electrodes on one line (eight pieces) out of the above, bonding wires are bonded at equal intervals, and bonding is performed on the electrodes on the other three lines (three sides) as well in the same manner. The ball bonding is performed on 32 aluminum electrodes in total. When including the wedge bonding to the lead frame, wire bonding of 32 sets in total is performed.

Next, the semiconductor chip including the bonding portions of 32 sets in total formed as described above, is molded by a molding machine by using an encapsulating resin. When the mold is solidified, the molded part is cut from the frame, and the vicinity of one line (one side) of the ball bonding portions in the molded part is cut. The cut mold is placed in a cylindrical mold in a direction in which a cross section of the ball bonding portion (a cross section as illustrated in FIG. 1) can be polished, an embedding resin is poured into the mold, and a curing agent is added to cause curing. After that, the cured cylindrical resin including the semiconductor chip is roughly polished by an abrader so that the vicinity of the center of the ball bonding portion is exposed as much as possible. When the polishing is performed to approximately the vicinity of the cross section of the center of the ball bonding portion, fine adjustment is performed by an ion milling apparatus so that a surface after being subjected to finishing of final polishing and including a ball center portion (a surface passing though the center line L of the wire portion and parallel to the center line L) is just exposed to be positioned at an analytical surface. When a wire width of the cross section of the wire portion becomes a length of the wire diameter, it is an indication that the cut surface is a surface including the ball center portion. As a surface to analyze the cut surface, a desired place thereof is subjected to a line analysis from the ball side toward the electrode side by the field-emission scanning electron microscopy/energy dispersive X-ray spectrometry (FE-SEM/EDX). The line analysis conditions include, for example, an acceleration voltage of 6 keV, a measurement region $\phi$ of 0.18 μm, and a measurement interval of 0.02 μm.

Next, operations to be exhibited by the respective configurations of the palladium-coated copper bonding wire of the present embodiment will be described. The reason why the configuration of the above-described embodiment enables achievement of both the ball bonding reliability and the suppression of occurrence of a shrinkage cavity is assumed as follows, as an example. In the ball bonding, an arc discharge is formed between a discharge torch and a wire tip, and by the heat from an arc current, the tip of a ball melts and a free air ball is formed. At this time, in a conventional palladium-coated copper wire, where the concentration of palladium in the ball bonding portion does not increase, palladium on the outer side of the wire is diffusively absorbed into the inside of the molten ball during the process of forming a free air ball from the metal of the wire melted by the arc heat input and the additive elements. When such a conventional wire is ball-bonded onto an aluminum-containing electrode, a copper-aluminum intermetallic compound, such as, for example, Cu9Al4, is easily corroded at the bonding interface between the aluminum-containing electrode and a ball bonding portion because the vicinity of a bonding surface does not become rich in palladium.

In semiconductor products, it is normal that the entire wire bonding is encapsulated in resin or the like. Halogen elements such as chlorine and bromine derived from this encapsulating resin, as well as moisture, sulfur, and so on from the atmosphere, enter the ball bonding interface to corrode the copper-aluminum intermetallic compound at the ball bonding interface, which has been problematic. Further, the higher the temperature and humidity of the atmosphere of the semiconductor element, the greater the corrosion tends to be. As the corrosion at the ball bonding interface progresses, separation and breaks occur at the ball bonding interface to cause an increase in electrical resistance, resulting in a problem of poor current flow.

In contrast to this, it is thought that in the wire having the specific composition and configuration in the present embodiment, the diffusion and absorption of palladium into the inside of the molten ball is suppressed during the process of forming the free air ball, and the unabsorbed palladium is concentrated and distributed in the vicinity of the surface of the ball to cover the surface of the ball. When the ball is bonded onto the aluminum-containing electrode with this unabsorbed palladium covering the surface of the free air ball, the bonding interface becomes rich in palladium, which has strong corrosion resistance. Therefore, it is presumed that the formation of the copper-aluminum intermetallic compound is suppressed, and further, the corrosion caused by halogen (chlorine in particular), sulfur, water, and so on coming from the outside is also suppressed. As a result of this, the ball bonding reliability improves, thereby making it possible to significantly improve the reliability under the high-temperature and high-humidity conditions in particular. From this point of view, the lower limit of the concentration of palladium in the wire is decided as the range that improves the ball bonding reliability.

In particular, when the sulfur group element having a predetermined concentration is contained in a palladium coating material when forming the palladium layer of the palladium-coated copper bonding wire, the palladium-concentrated region on the surface of the free air ball is formed in a quite stable manner. Further, it can be considered that, because of the presence of a predetermined amount of the sulfur group element, the palladium-concentrated region is stably maintained on the surface of the free air ball until the bonding to the aluminum electrode, resulting in that the palladium-concentrated bonding region of the embodiment is easily formed. For this reason, according to the wire bonding structure using the palladium-coated copper bonding wire containing the sulfur group element as described above in the wire portion, it is possible to significantly improve the bonding reliability under high temperature and high humidity.

On the other hand, as described above, even the configuration with the surface of the free air ball made rich in palladium often failed to improve the bonding reliability when aiming for use under severe conditions. The reason for this is thought that an object to be subjected to the second bonding of the wire bonding has a gold plating, silver plating, or the like on its surface in many cases, and the gold or silver derived from this plating adheres to a tail portion of the wire (an end portion of the wire that has been torn off) when the wire is cut after the second bonding of the wire bonding, causing a shrinkage cavity.

The "shrinkage cavity" is a wrinkle-like groove observed in the surface of the solidified free air ball. When there is a shrinkage cavity in the surface of the solidified free air ball, a void is made in a portion of the bonding surface of the ball bonding of the electrode on the semiconductor chip, corresponding to the above-described groove. Therefore, it is thought that depending on the size of the void, a bonding strength of the bonding surface is weakened with time starting from this void or corrosion is likely to occur, thereby reducing the bonding reliability.

As a result of the earnest examination, the inventors found out that some of the above-described shrinkage cavities are problematic and large, and the others are unproblematic and small. That is, when the surface of the solidified free air ball has a shrinkage cavity having a predetermined size or more, the void at the interface between the electrode and the ball bonding portion tends to be large, causing a significant decrease in the bonding reliability. On the other hand, when the shrinkage cavity is smaller than the above-described size, the effect on the bonding reliability does not become a problem because the void is small. As the size of the shrinkage cavity that does not cause such a problem, the maximum length of the shrinkage cavity only needs to be two-thirds or less of the diameter of a wire in a SEM observation photograph of the shrinkage cavity. For example, when the diameter of the wire is 18 μm, the shrinkage cavity having a maximum length of greater than 12 μm can be sufficiently identified as a problematic large shrinkage cavity. It is presumed that the shrinkage cavities smaller than this size have little effect on the bonding reliability.

Further, they found out that the reason why the problematic large shrinkage cavity is formed relies on the concentration of palladium of the palladium-concentrated region (actually a mixed region of palladium and copper) covering the surface of the free air ball. That is, in the case where the concentration of palladium of the palladium-concentrated region in the surface of the free air ball exceeds a certain concentration, when the palladium-concentrated region solidifies, the inside of the ball is still soft. Accordingly, due to factors such as the difference in composition between the gold adhering portion in the vicinity of the surface of the free air ball and the region without gold adhesion, the difference in solidification speed widens and the gold adhering portion becomes a final solidification portion. Then, it was presumed that when the molten ball becomes solid, the gold adhering portion, where shrinkage is concentrated, shrinks to the inside of the ball, and a problematic large shrinkage cavity is formed. This is applied also to the case where silver adheres to the tail portion.

Conversely, when the concentration of palladium of the palladium-concentrated region is sufficiently low, the time difference in solidification of copper between the palladium-concentrated region and the inside of the ball is thought to be small. As a result of this, even if gold adheres to the ball, it does not shrink to the inside of the ball, thus not causing a problematic large shrinkage cavity. From such a point of view, the upper limit of the concentration of palladium of the surface of the free air ball is decided. When the ball is bonded onto the aluminum-containing electrode with a large shrinkage cavity being formed in the free air ball, a void is made at the interface between the electrode and the ball bonding portion. As a result of this, the bonding strength of the ball bonding interface is weakened and corrosion is likely to occur, which are problematic.

The sulfur group element in the palladium-coated copper bonding wire contributes to the formation of a palladium-distributed region in the vicinity of the surface of the free air ball described above. The sulfur group element is highly reactive with copper, and thus, it is thought that it is concentrated in a region where copper and palladium are in contact, mainly in the early stage when the metal of the wire melts. Reaction products of the sulfur group element and copper concentrated in this region where copper and palladium are in contact are thought to shield palladium from dissolution into the molten copper. From such a viewpoint, the amount of the sulfur group element is decided.

In order to obtain the above-described effect, 50.0% or more of the sulfur group element contained in the entire palladium-coated copper bonding wire is preferably contained between the surface of the palladium-coated copper bonding wire and a place with 50.0 atom % of palladium relative to the total of palladium and copper. This is thought to facilitate the formation of the palladium-distributed region in the vicinity of the surface of the free air ball, and it is possible to further improve the bonding reliability of the ball bonding.

(Manufacturing Method of Palladium-Coated Copper Bonding Wire)

Next, a manufacturing method of the palladium-coated copper bonding wire of the present embodiment will be described. The palladium-coated copper bonding wire of the present embodiment is obtained by coating the surface of a copper wire rod, which contains, as its main component, copper to be a core material, with palladium, performing wire drawing, and performing heat treatment as necessary. Gold coating may be performed after the palladium coating, or wire drawing and heat treatment may be performed in stages after palladium or gold coating is performed.

When copper is used as the core material, copper of a predetermined purity is melted, and when a copper alloy is used, copper of a predetermined purity is melted together with trace elements to be added, to thereby obtain a material of a copper core material or a material of a copper alloy core material. A heating furnace such as an arc heating furnace, a high-frequency heating furnace, a resistance heating furnace, or a continuous casting furnace is used for melting. For the purpose of preventing mixture of oxygen and hydrogen from the atmosphere, the atmosphere during copper melting in the heating furnace is preferably maintained to a vacuum or an inert gas atmosphere such as argon or nitrogen. The molten material of the core material is cast and solidified to a predetermined wire diameter from the heating furnace, or the molten material of the core material is cast into a mold to make an ingot, and the ingot is repeatedly rolled and then is drawn to a predetermined wire diameter, and a copper wire rod is obtained.

Examples of the method of coating the surface of the copper wire rod with palladium or gold include a plating method (wet method) and a vapor deposition method (dry method). The plating method may be either an electrolytic plating method or an electroless plating method. Electrolytic plating, such as strike plating or flash plating, is preferable because a plating speed is fast and the adhesion of the palladium layer to the core material is good when the electrolytic plating is used for palladium plating. As a method of containing the sulfur group element in the palladium layer by the plating method, there is a method of using a plating solution containing a plating additive containing sulfur, selenium, or tellurium for a palladium plating solution, and adjusting the type and amount of the plating additive. This also makes it possible to adjust the concentration of the sulfur group element in the wire.

As the vapor deposition method, physical adsorption such as a sputtering method, an ion plating method, or vacuum vapor deposition, and chemical adsorption such as plasma CVD can be used. According to these methods, it is not necessary to clean the palladium coating or the gold coating after formation, and there is no concern about surface contamination or the like during cleaning. As a method of containing the sulfur group element in the palladium layer by the vapor deposition method, there is a method of forming a palladium layer by magnetron sputtering or the like while using a palladium target containing the sulfur group element.

In this manner, the copper wire rod having palladium coating and the other coating of gold or the like according to need is subsequently drawn to a final wire diameter and heat-treated. The wire drawing and the heat treatment may be performed in stages. Further, in the above, the method of drawing the palladium-coated and gold-coated copper wire rod to a final wire diameter has been described, but the palladium-coated copper wire rod may be drawn to a predetermined wire diameter, and then coated with gold, and thereafter drawn to a final wire diameter.

A worked texture is formed in the process of drawing the copper wire rod, recovery and recrystallization progress to form a recrystallized texture in the heat treatment process, and these textures relate to each other to finally decide textures and crystal orientations of the wire. After the formation of the palladium coating and the other coating formed according to need, a working ratio and heat treatment conditions are set properly, which enables to adjust <111> and <100> orientation ratios of the cross section of the palladium-coated copper bonding wire. Normally, there is a tendency that the higher the working ratio, the larger the <111> orientation ratio and the smaller the <100> orientation ratio. Further, for the control of the orientation ratios, the working ratio is more dominant than the heat treatment conditions, but an increase in a heat treatment temperature makes it possible to increase the <100> ratio, and this is effective for the control of the orientation ratios based on the heat treatment temperature in a range of low working ratio, in particular.

Further, even if the heat treatment temperature is the same, the properties of the wire are sometimes influenced by a structure and a speed of a heat treatment apparatus. Further, even if the heat treatment conditions are the same in the same apparatus, the properties of the wire are sometimes influenced by the type and the amount of the trace elements in the core material. Regarding this point, by adjusting not only the above-described working ratio but also an elongation percentage in strain relief heat treatment in the manufacturing process of the palladium-coated copper bonding wire of the present embodiment, it is possible to control the crystal orientation ratios of the cross section of the wire. This elongation percentage can be controlled mainly by a temperature and a time of the strain relief heat treatment. In order to obtain, as the crystal orientation ratios of the cross section of the wire, 15% or more of <100> and 50% or less of <111>, it is preferable to adjust the elongation percentage to fall within a range of 5 to 15%. Within this range of elongation percentage, the adjustment to increase the elongation percentage at the low working ratio, and to reduce the elongation percentage at the high working ratio, is effective for controlling <100> to be 15% or more and <111> to be 50% or less.

The wire drawing is preferably performed in stages by using plural diamond dies. Although a reduction of area per one diamond die exerts less influence on the <111> and <100> orientation ratios of the cross section of the wire than the working ratio, when the reduction of area is smaller than 5%, the number of wire drawing processes is excessively increased, and when the reduction of area becomes larger than 15%, a tensile force during the wire drawing becomes large, and wire breakage is likely to occur. By taking these into consideration, the reduction of area (working ratio) per one diamond die is preferably 5.0 to 15.0%.

In the final heat treatment, there is performed the strain relief heat treatment to relieve strain of a metal structure remaining inside the wire at the final wire diameter. The temperature and the time of the strain relief heat treatment (refining heat treatment) are decided so that the elongation percentage falls within the range of 5% to 15% while taking the crystal orientations of the cross section of the wire and the wire properties into consideration. The elongation percentage was set to a value obtained by a tensile test of a bonding wire. The elongation percentage is calculated as a percentage of elongation length when breaks occur at the time of pulling a bonding wire with a length of 10 cm at a rate of 20 mm/min and a load cell rating of 2 N by using a device for tensile experiment (AUTO COM manufactured by T.S.E Co., Ltd.), for example. As the elongation percentage, it is desirable to determine an average value of five wires, in consideration of a variation in measured results.

Besides, heat treatment according to purposes may be performed in any stage of the wire manufacture. Examples of such heat treatment include diffusion heat treatment in which adjacent metals are diffused to increase the bonding strength after the palladium coating or the gold coating. Performing the diffusion heat treatment makes it possible to improve the bonding strength between dissimilar metals. Regarding the conditions of the diffusion heat treatment, the temperature and the time are decided in consideration of the required wire properties.

As a method of the heat treatment, running heat treatment, in which a wire is passed through an atmosphere of a heating vessel heated to a predetermined temperature to be heat-treated, is preferable because the heat treatment conditions can be adjusted easily. In the case of the running heat treatment, the heat treatment time can be calculated by the speed at which the wire passes and the distance of the wire passing in the heating vessel. A tubular electric furnace or the like is used as the heating vessel.

According to the palladium-coated copper bonding wire of the present embodiment explained above, the shrinkage cavity during ball formation is suppressed, the ball bonding reliability is excellent even under the high-temperature and high-humidity, and even in the narrow-pitch bonding, the circularity of the shape of the first bonding can be improved. Therefore, since the wire bonding structure with quite high long-term reliability can be formed, the palladium-coated copper bonding wire of the present embodiment is suitable for QFP (Quad Flat Packaging), BGA (Ball Grid Array), and QFN (Quad For Non-Lead Packaging). Further, since the wire bonding structure with high reliability can be formed, the palladium-coated copper bonding wire of the present embodiment is suitable for use in high-temperature and high-humidity environments, such as in devices for automobile use. Furthermore, since the circularity of the first bonding is improved, the palladium-coated copper bonding wire of the present embodiment is also suitable for a narrow-pitch bonding structure of a small-sized semiconductor device and the like.

(Semiconductor Device and Manufacturing Method Thereof)

Figure 7:
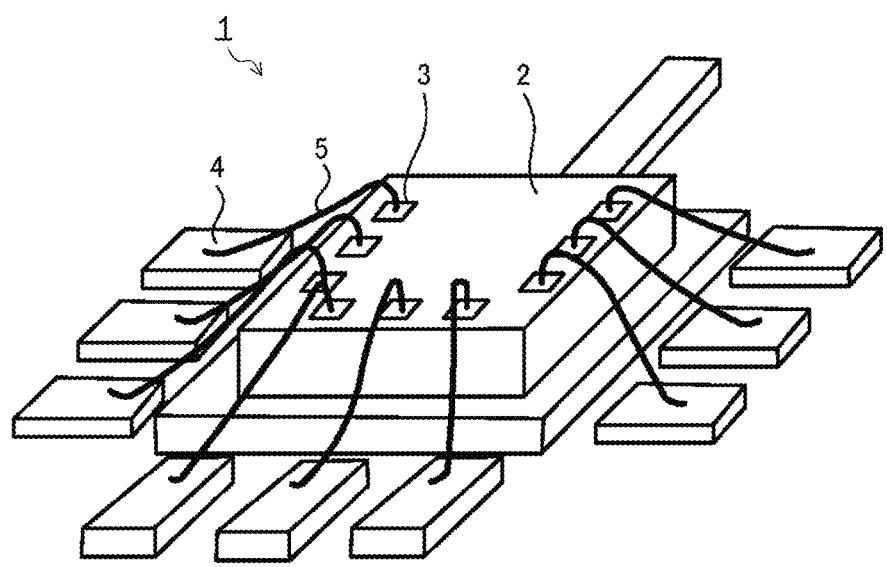
FIG. 7 is a schematic view illustrating a semiconductor device in an embodiment.

Next, a semiconductor device using the palladium-coated copper bonding wires in the above-described embodiment will be described. As illustrated in FIG. 7, a semiconductor device 1 of the present embodiment includes a semiconductor chip 2, aluminum-containing aluminum electrodes 3 provided on the semiconductor chip 2, gold-coated external electrodes 4 provided outside the semiconductor chip 2, and bonding wires 5 connecting the aluminum electrodes 3 and surfaces of the external electrodes 4. Note that in FIG. 7, the case of having a gold coating on the external electrode is explained as an example, but the same is applied even if a silver coating is provided in place of the gold coating or a silver coating is provided together with the gold coating.

In the semiconductor device 1, the bonding wire 5 is made of the palladium-coated copper bonding wire in the above-described embodiment. Further, it includes a palladium-concentrated bonding region with 2.0 mass % or more of the concentration of palladium relative to the total of a constituent element of the surface of the aluminum electrode 3, copper, and palladium in a bonding surface of the aluminum electrode 3 and the bonding wire 5.

The semiconductor chip 2 is made by including an integrated circuit (IC) made of a silicon (Si) semiconductor, a compound semiconductor, or the like. The aluminum electrode is formed, for example, by coating a surface of a silicon base material with an electrode material such as Al, AlSiCu, or AlCu. The external electrode 4 is an electrode for supplying power to the semiconductor chip 2 from the outside. The power from the external electrode 4 is supplied to the semiconductor chip 2 via the bonding wire 5.

In the manufacture of the semiconductor device 1 of the present embodiment, the connection of the aluminum electrode 3 and the external electrode 4 by the bonding wire 5 is made as follows, for example. Using a bonding device, a capillary jig used for the connection by passing a bonding wire through its inside, and so on, for example, heat is input to the tip of the wire gripped by the capillary by arc discharge, to heat and melt the tip of the wire. Thereby, a free air ball is formed at the tip of the wire. After that, for example, with the semiconductor chip 2 heated within a range of 140 to 200° C., this free air ball is crimped and bonded onto the aluminum electrode 3 to form ball bonding (first bonding). Thereafter, the opposite end of the bonding wire 5 apart from the first bonding by a predetermined interval is directly subjected to wedge bonding (second bonding) to the external electrode 4 by ultrasonic crimping.

In the manufacturing method of the semiconductor device of the present embodiment, the free air ball forming conditions are the same as those described above. Concretely, for example, when the diameter of the bonding wire 5 is 10 to 30 µm, preferably 15 to 25 µm, and more preferably 18 to 20 µm, a bonder apparatus is used and an arc discharge current value is 30 to 90 mA. In normal bonding, arc discharge conditions are set so that the diameter of the free air ball is more than 1.7 times and 2.3 times or less the diameter of the wire. In the case of the narrow-pitch bonding, although depending on a width of an electrode interval, for example, when the diameter of the bonding wire 5 is 18 µm, the arc discharge conditions are set so that the diameter of the free air ball is 1.5 to 1.7 times the diameter of the wire. For a bonder apparatus, a commercially-available product such as a bonder apparatus (fully automatic Cu wire bonder; IConn ProCu PLUS) manufactured by KANDS Co., Ltd., for example, can be used. When using such a bonder apparatus, the apparatus is preferably set that a discharge time is 50 to 1000 µs, an EFO-Gap is 25 to 45 mil (about 635 to 1143 µm), and a tail length is 6 to 12 mil (about 152 to 305 µm). When another bonder apparatus other than this bonder apparatus is used, the conditions only need to be the same as above, which are, for example, the condition under which the diameter of the free air ball becomes the same size as above. Further, in order to make a mixed gas atmosphere of nitrogen and hydrogen or a nitrogen gas atmosphere for the tip portion of the wire, the above-described gas is sprayed at a gas flow rate of 0.2 to 0.8 L/minute, and preferably 0.3 to 0.6 L/minute. The gas when forming the free air ball is preferably a mixed gas of 95.0 vol % of nitrogen and 5.0 vol % of hydrogen, and the diameter of the free air ball may be within the above-described range as the target value.

Further, the conditions of the ball bonding and the wedge bonding can be appropriately adjusted according to the structure and the application of the semiconductor device, and, for example, regarding a wire whose diameter $\phi$ is 18 µm and on which a free air ball with a diameter of 32 µm is formed, a ball crimping force is 7.5 gf, an ultrasonic application output is 70 mA, a ball crimping time is 15 ms, and a crimping temperature is 150° C., as settings of the bonder apparatus. Accordingly, it is possible to form ball bonding in which the height Y of the second ball compressed portion 20b is approximately 10 µm, and the maximum width $X_0$ of the second ball compressed portion 20b in a direction substantially parallel to the bonding surface 21 is approximately 40 µm. The wedge bonding can be performed with a loop length of 2 mm under conditions of, in a scrubbing mode, a crimping force of 70 gf, a crimping time of 20 ms, a crimping temperature of 150° C., a frequency of 200 kHz, an amplitude of 3.0 µm, and 2 cycles.

The manufacturing method of the semiconductor device of the embodiment manufactures a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode. The bonding wire is a palladium-coated copper bonding wire including: a core material containing copper as a main component; and a palladium layer on the core material, and containing a sulfur group element. A concentration of palladium relative to the total of copper, palladium, and the sulfur group element of the palladium-coated copper bonding wire, is 1.0 mass % or more and 4.0 mass % or less, and a total concentration of the sulfur group element is 5.0 mass ppm or more and 50 mass ppm or less. The manufacturing method includes: forming, at the tip of the palladium-coated copper bonding wire, a free air ball including a palladium-concentrated region with the average concentration of palladium of 6.5 atom % or more and 30.0 atom % or less relative to the total of copper and palladium within a range from a surface of a tip portion of the ball to 5.0 nm or more and 100.0 nm or less; bonding the palladium-coated copper bonding wire to the aluminum electrode via the free air ball; and bonding a portion of the palladium-coated copper bonding wire apart from the free air ball by substantially a length of the palladium-coated copper bonding wire to the surface of the external electrode.

The semiconductor device of the embodiment is suitable for QFP (Quad Flat Packaging), BGA (Ball Grid Array), and QFN (Quad For Non-Lead Packaging) used in printed wiring boards, and the like, for example.

According to the semiconductor device of the present embodiment explained above, in the wire bonding, the shrinkage cavity of the ball during ball bonding is suppressed, the ball bonding reliability is excellent even under the high-temperature and high-humidity, and the circularity of the shape of the first bonding can be improved. Therefore, since a bonding structure with quite high long-term reliability can be formed, the semiconductor device of the present embodiment is suitable for use in high-temperature and high-humidity environments, such as in devices for automobile use. Further, according to the manufacturing method of the semiconductor device of the present embodiment, since a bonding structure with high long-term reliability is formed in not only normal bonding but also narrow-pitch bonding, it is possible to obtain a semiconductor device suitable for use in high-temperature and high-humidity environments, such as in devices for automobile use. Further, it is possible to provide a small-sized semiconductor device with quite high reliability, in which narrow-pitch bonding is performed.

EXAMPLES

Next, examples will be explained. The present invention is not limited to the following examples. Examples 1 to 17 and Examples 31 to 39 are examples, and Examples 18 to 30 and Examples 40 to 43 are comparative examples.

Copper (Cu) with a purity of 99.99 mass % or more was used as the core material, this was continuously cast and rolled while preheat treatment being performed thereon, and then primarily drawn, to thereby obtain a copper wire rod with a diameter of 18 to 500 μm. Regarding a wire in which the copper core material contains trace elements (one or more of P, Pt, Pd, Rh, Ni, and In), a copper alloy to which the respective trace elements were added to satisfy predetermined concentrations described in respective Tables was used to obtain a copper alloy wire rod in the same manner as above. For the trace elements, raw materials each having a purity of 99.99 mass % or more were used. Although the following is the explanation regarding the case where the palladium-coated copper bonding wire using the copper wire rod is manufactured, the same applies to the case where the copper alloy wire rod is used.

The palladium coating layer was formed as follows. Plating baths were prepared by adding additives containing sulfur, selenium, and tellurium to commercially-available palladium electroplating baths, and controlling the concentrations of sulfur, selenium, and tellurium in the plating baths so that the concentrations relative to the entire wire (the total of copper, palladium, and sulfur group elements) would be the concentrations described in Table below, respectively. With the copper wire rod immersed in the plating bath, a current was passed through the copper wire rod at a current density of 0.75 A/dm$^2$ to form a palladium coating containing sulfur, selenium, or tellurium. In the case of forming a palladium coating containing two or more of sulfur, selenium, and tellurium, a plating bath containing two or more of the above-described additives was used.

Thereafter, continuous secondary wire drawing was performed with diamond dies in a wet process without performing baking treatment. Refining heat treatment with adjusted heat treatment temperature and heat treatment time was performed so that an elongation percentage became each value in a range of 6% to 14% in examples at the final wire diameter, to thereby obtain a palladium-coated copper bonding wire with a diameter of 18 μm or 25 μm.

Note that the working ratio of each example, calculated by wire cross-sectional areas before and after wire drawing from the wire after coating to the final wire diameter, is in a range of 52 to 99.9% in examples, and the wire speed in the wire drawing is 100 to 1000 m/minute.

A palladium-coated copper bonding wire including a gold layer was produced as follows. In the manufacturing process of the above-described palladium-coated copper bonding wire, after coating with palladium, gold plating was further applied using a commercially-available gold plating bath. Note that the concentration of each element in Table was calculated without including the concentration of gold of the gold layer in the entire wire.

The concentration of palladium in the palladium-coated copper bonding wire was measured as follows. The manufactured wire of about 1000 m was dissolved in aqua regia, and the concentration of palladium (Pd) in the solution was determined by high-frequency inductively coupled plasma emission spectroscopy (ICPS-8100 manufactured by Shimadzu Corporation). The determined value is shown in the column of "Pd (derived from Pd layer)" in Table below. Note that in Table below, an abbreviated name of "mass" means mass.

The concentration of the sulfur group elements in the palladium-coated copper bonding wire was measured as follows. The manufactured wire of about 100 m was dissolved in aqua regia, and the concentration of sulfur (S), selenium (Se), or tellurium (Te) in the solution was determined by an inductively coupled plasma mass spectrometer (Agilent 8800 manufactured by Agilent Technologies Japan, Ltd.). The determined values are shown in the column of "sulfur group element" in Table below.

The compositions of the palladium-coated copper bonding wires of examples and comparative examples obtained above are shown in Tables 1, 2, 5. The thickness of the gold layer is the value determined by calculating the mass of gold per unit length from the concentration of gold and the specific gravity of gold, and assuming that the wire having a unit length has a perfectly circular cross section and gold is uniformly present on the uppermost surface of the wire having a unit length. Next, the following property evaluations were performed on the palladium-coated copper bonding wires obtained above.

(Observation of Crack in Wire Surface)

The copper wire rod after palladium plating (after gold coating regarding the copper wire rod having a gold layer) was subjected to a torsion test, and the appearance of the surface of the wire rod after being subjected to the torsion test was observed with an optical stereomicroscope (product name: SZX16 manufactured by Olympus Corporation) to perform evaluation based on whether a crack of palladium had reached copper of the core material. Those with a crack not reaching copper were evaluated as having no crack in a wire surface (○), and those with a crack reaching copper were evaluated as having a crack in a wire surface (x). In the torsion test, a device manufactured by MAEKAWA TESTING MACHINE MFG. Co., Ltd. (device name: TO-202) was used, both ends of an about 20-cm sampled wire were fixed and rotated 180 degrees clockwise and 180 degrees counterclockwise, the rotations were performed for 7 sets, and then the appearance was observed. Results are shown in Tables 3, 4. Note that the wires with a crack reaching copper are shown as not performed (−) in Table because not only wire drawing but also evaluations of a shrinkage cavity and a HAST, and so on thereafter were not performed thereon.

(Measurement of Crystal Orientation of Cross Section of Wire)

The crystal orientations of the cross section of the wire were measured as follows. Plural wire samples each obtained by cutting the produced palladium-coated copper bonding wire by a length of several centimeters were prepared. The wire sample was attached onto a plate of metal (Ag-plated frame) in a straight line and in a flat manner while taking care not to extend or loosen the wire sample. After that, the wire sample together with the metal plate was placed in a cylindrical mold so that the metal plate became a bottom surface of the cylinder, an embedding resin was poured into the mold, and then a curing agent was added to cure the resin. Subsequently, the cured cylindrical resin including the wire sample was roughly polished by an abrader so as to expose a cross section vertical to a wire longitudinal direction. After that, the cut surface was finished by final polishing, and subsequently, a residual strain of the polished surface was removed by ion milling, to thereby obtain a smooth surface. Note that the ion milling apparatus was finely adjusted to make the cut surface of the wire to be vertical to the wire longitudinal direction.

Onto a sample stage of a field-emission scanning electron microscope (FE-SEM), the wire sample was attached so that its transverse section (namely, the polished surface of the sample) became parallel to the sample stage, and crystal orientations of the cross section were measured by the FE-SEM by setting an observation magnification to 2500 times, an acceleration voltage to 20 keV, a measurement region to about 21×21 μm, a measurement interval (Step Size) to 0.06 μm, and a standard phase (Phase) to Copper. The crystal orientations obtained as above were analyzed by using dedicated software for crystal orientation analysis (OIM analysis manufactured by TSL Solutions). In the crystal orientation analysis using pattern data obtained by the EBSP method, it is required to previously set a crystal system (standard phase) of the sample from which the pattern data has been obtained in the dedicated software, and the analysis is performed by selecting a standard pattern file (material file) of an analysis target element attached to the dedicated software. Specifically, in the case of an alloy other than pure metal, a material file whose composition is similar to that of the sample is normally required, but since an amount of the trace elements in the copper core material made of the copper alloy used in the present example was extremely small, it was confirmed that the copper core material using the copper alloy as its material also had a crystal system which was almost the same as that of pure copper whose processing condition was similar to that of the copper alloy. Further, the concentration of palladium in the entire wire was also low, so that it was also confirmed that a ratio of the cross-sectional area of the palladium layer to the cross section of the wire was low, and thus the structure of the palladium layer of the present invention exerted almost no influence on the crystal orientation ratios of the cross section of the wire. Accordingly, in the crystal orientation analysis, Copper was selected as the standard phase (Phase) of the material pattern of the dedicated software. Further, in the EBSP method, the magnifications, the acceleration voltage, the measurement region, and the measurement interval can be set according to a size of the wire sample and purposes of analysis, and in the present example, conditions capable of performing efficient measurement were selected by considering a measurement time and a measurement accuracy, in which it was confirmed that there was no influence on the measurement result of the crystal orientation of the cross section of the wire before and after the measurement performed under the conditions.

Discriminating conditions of crystal grains in the dedicated software were set, and a crystal orientation of the measured sample was analyzed. The discriminating conditions of the crystal grains in the dedicated software can be normally set according to purposes of analysis, but since they exert almost no influence on analysis results of the crystal orientations, in the present example, it was set that when five or more pixels were connected with misorientation of 15° or less, they were recognized as one crystal grain, and among the crystal grains, a ratio of crystal grains having predetermined orientations such as <111> and <100> orientations was determined. The orientation was decided based on the wire longitudinal direction, and ratios of <111> and <100> orientations in each of which the angular difference of the crystal orientation was within 15° were determined.

Further, in the analysis of EBSP measurement data, there may be a region in which the crystal orientation cannot be measured because of roughness, a residual strain due to polishing or the like, contamination, presence of an oxide film, or the like on the measurement surface. For this reason, the reliability was set, and based on this reliability, an area of only crystal orientations capable of being identified within the measurement area was set to a population and a ratio of respective orientations (referred to as an orientation ratio, hereinafter) was automatically calculated by the dedicated software. Namely, the orientation ratio was determined by excluding a portion where the crystal orientation cannot be measured, a portion where even if the measurement can be performed but the reliability of the orientation analysis is low, and the like. Here, regarding the reliability, a parameter thereof is sometimes prepared in analysis software, and it is possible to select a criterion according to a state of the sample, purposes of analysis, and so on, by using several kinds of parameters such as, for example, Confidential Index (CI value), and Image Quality (IQ value). For example, the CI value was set to 0.1 or more, and a portion having the CI value of less than 0.1 was excluded. Besides, a clean-up processing function prepared for the analysis software was utilized, and orientation data or the like of a point where the measurement could not be performed well was replaced with data of a pixel in the periphery of the point, where the normal measurement was performed, to thereby complement an incomplete portion of the measurement. When the points where the measurement could not be performed well sparsely exist, this method is effective for removing the points. However, excessive clean-up processing sometimes causes artifact, so that, for example, the crystal grain is recognized when five or more pixels are connected with misorientation of 15° or less, a Grain Dilation method was performed once, and in addition to that, a Grain CI Standardization method was performed once.
(Free Air Ball Analysis)

With the palladium-coated copper bonding wire with a diameter of 18 μm obtained in Example 1, a free air ball with a ball diameter (FAB diameter) of about 32 μm (about 1.8 times the diameter of the wire) was formed in a (fully automatic Cu wire bonder; IConn ProCu PLUS) type ultrasonic device manufactured by KANDS Co., Ltd. by setting an arc discharge current value (Electronic Flame-Off (EFO) current value) to 65 mA and adjusting a discharge time in a range of 50 to 1000 μs. A free air ball forming atmosphere was a mixed gas of 95.0 vol % of nitrogen gas and 5.0 vol % of hydrogen gas, and the gas was sprayed onto the tip of the wire at a gas flow rate of 5.0 L/minute. Substantially the center of the formed free air ball on the tip side (the side opposite to a wire neck portion) was analyzed in the depth direction by a scanning Auger electron spectroscopy analyzer (JAMP-9500F (device name) manufactured by JEOL Ltd.). The setting conditions of the Auger electron spectroscopy analyzer are as follows: an acceleration voltage of a primary electron beam of 10 kV, a current of 50 nA, a beam diameter of 5 μm, an acceleration voltage of argon ion sputtering of 1 kV, and a sputtering rate of 2.5 nm/minute (in terms of $SiO_2$). The average concentration of palladium relative to the total of copper and palladium was determined by analyzing nine or more points at equal intervals from the surface of the tip portion of the free air ball to 5.0 to 100.0 nm in the depth direction. Concrete analysis points are 31 points every 1.0 nm from the surface to about 0 to 30.0 nm, 5 points every 6 nm from 31.0 to 60.0 nm, and 35 points every 12.0 nm from 61.0 to 480.0 nm.

Figure 4:
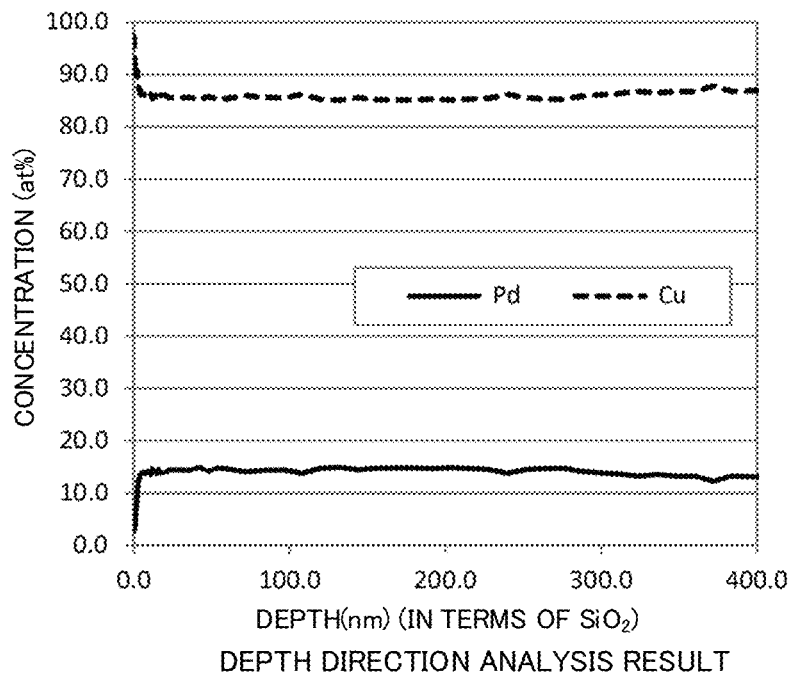
FIG. 4 is an Auger (FE-AES) analysis profile of a surface of a tip portion of the free air ball in the example.

In the other examples, with the palladium-coated copper bonding wire obtained above, a free air ball was formed by using the same fully automatic Cu wire bonder as in Example 1 so as to obtain a predetermined ball diameter in a range of 1.8 to 2.3 times the diameter of the wire as shown in Table under the same conditions as in Example 1 except that the same Electronic Flame-Off (EFO) current as in Example 1 was adjusted to a predetermined value in a range of 30 to 90 mA and the same discharge time as in Example 1 was adjusted to a predetermined value in a range of 50 to 1000 μs. In Example 10 and Example 31, a copper core material containing 1.3 mass ppm of palladium relative to the entire core material was used. In each of the obtained free air balls in the examples, the average concentration of palladium from the surface of the tip portion of the ball to 5.0 to 100.0 nm in the depth direction was determined as in Example 1. Results are shown in a column of "concentration of Pd of surface" regarding the analysis of FAB-attached wire in Table along with the composition of the wire and the free air ball forming conditions. Further, an Auger analysis profile of the free air ball in Example 14 from the tip portion in the depth direction is illustrated in FIG. 4. Note that in Examples 2 to 17, and Examples 31 to 39, the average concentration of palladium from the surface of the tip portion of the ball to 5.0 to 100.0 nm in the depth direction was determined, but the average concentration of palladium is about the same as the values in Table below even in the range of 5.0 to 400.0 nm.

(Shrinkage Cavity Evaluation)

Figure 2:
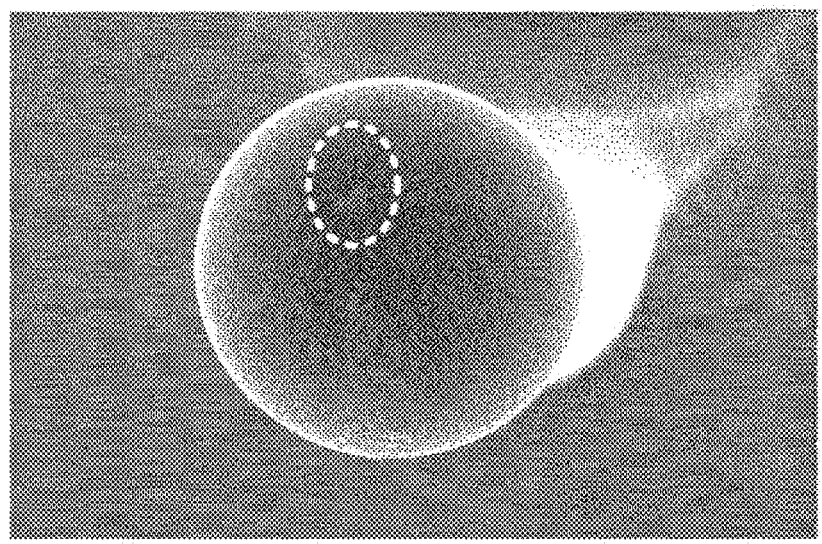
FIG. 2 is a photograph of a free air ball having an unproblematic small shrinkage cavity observed in an example.
Figure 3:
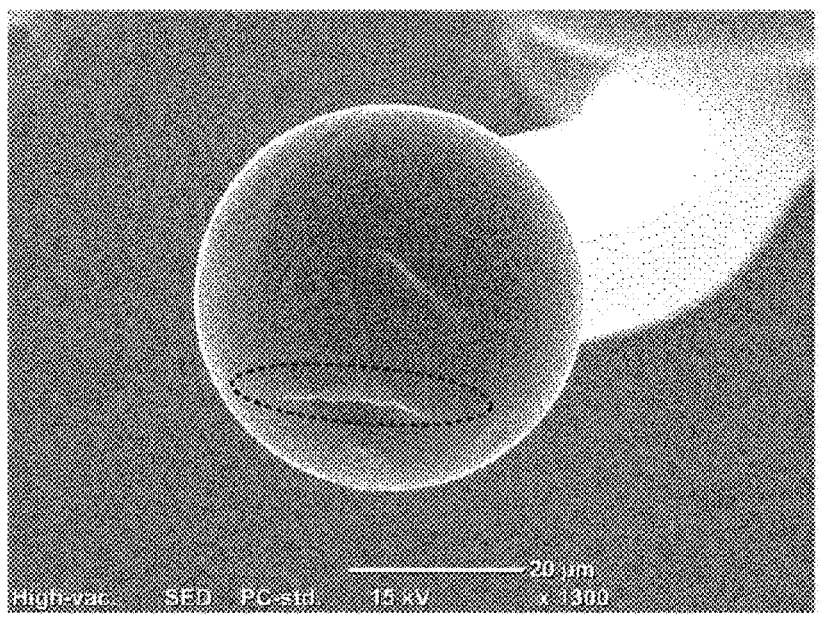
FIG. 3 is a photograph of a free air ball having a large shrinkage cavity observed in a comparative example.

Further, 30 free air balls formed under the same conditions as above were observed with the SEM for the presence/absence of a large shrinkage cavity in the surface of the ball. In SEM observation photographs, a shrinkage cavity with a maximum length of greater than 12 μm was evaluated as a problematic shrinkage cavity, and a shrinkage cavity with a maximum length of 12 μm or less was evaluated as an unproblematic shrinkage cavity. Note that FIG. 2 illustrates a free air ball with an unproblematic small shrinkage cavity, FIG. 3 illustrates a free air ball with a problematic large shrinkage cavity, and the shrinkage cavities are each circled and indicated by a broken line in a photograph. The problematic large shrinkage cavity is a large wrinkle-like groove formed in the surface of the free air ball, as illustrated in FIG. 3. Those with no shrinkage cavity and those with an unproblematic small shrinkage cavity were evaluated as having no shrinkage cavity (○), and those with at least one problematic shrinkage cavity were evaluated as having a shrinkage cavity (x).

(Circularity)

The evaluation of the circularity of the first bonding was performed for each of a case of normal bonding and a case of narrow-pitch bonding as follows. In the case of normal bonding, a free air ball was formed in the same manner as above, in Example 1 with a free air ball diameter of 32 μm. Subsequently, ball bonding conditions (a ball crimping force of 7.5 gf, an ultrasonic application output of 70 mA, a ball crimping time of 15 ms, and a crimping temperature of 150° C.) were adjusted in a bonder apparatus so as to make the height Y of the second ball compressed portion 20b to be 10 μm, and the maximum width $X_0$ of the second ball compressed portion 20b in a direction parallel to the bonding surface 21 to be 40 μm, and ball bonding was formed on an aluminum electrode of a chip. In the other examples, the ball bonding conditions were adjusted so that the above-described maximum width $X_0$ of the bonding surface became about 1.2 to 1.3 times the ball diameter.

In the evaluation of the circularity of the ball portion in the normal bonding, bonded balls were observed from above regarding the first bonding of 100 wires, a maximum width of a crimped ball and a width orthogonal to the maximum width were measured, and a ratio between the maximum width and the width orthogonal to the maximum width (maximum width/width orthogonal to maximum width) was determined. When an average value of the ratios of the above-described 100 wires was 1.15 or more, it was judged as defective (described as "D"), and when the average value was 1.1 or more and 1.15 or less, it was judged that improvement in mass production is desirable (described as "C"). The case where this ratio was 1.1 or less was classified into two, in which the case of having a ball with the value of ratio (maximum width/width orthogonal to maximum width) of 1.1 or more was judged as good (described as "B"), and the case of having no ball with the value of ratio of 1.1 or more was judged as very good (described as "A").

The evaluation of the circularity of the narrow-pitch bonding was performed as follows. A free air ball was formed by using the same fully automatic Cu wire bonder as in the above-described free air ball analysis so that a ball diameter became a predetermined size in a range of 1.5 to 1.7 times the diameter of the wire as shown in Table, in which the Electronic Flame-Off (EFO) current was adjusted to 65 mA and the discharge time was adjusted to a predetermined value in a range of 50 to 1000 μs, and the free air ball was crimped onto an electrode. In the first bonding, adjustment was performed in the range of bonding conditions of the normal bonding described above so that the maximum width $X_0$ of the bonding ball became about 1.2 to 1.3 times the ball diameter. In Example 1, the maximum width $X_0$ of the bonding ball was about 35 μm.

In the evaluation of the circularity of the ball bonding portion of the small-diameter ball used in the narrow-pitch bonding, bonded balls were observed from above regarding the first bonding of 100 wires, a maximum width of a crimped ball and a width orthogonal to the maximum width were measured, and a ratio between the maximum width and the width orthogonal to the maximum width (maximum width/width orthogonal to maximum width) was determined. When an average value of the ratios of the above-described 100 wires was 1.1 or more, it was judged as defective (described as "D"), and when the average value was 1.05 or more and 1.1 or less, it was judged that improvement is required (described as "C"). The case where this ratio was 1.05 or less was classified into two, in which the case of having a ball with the value of ratio (maximum width/width orthogonal to maximum width) of 1.05 or more was judged as good (described as "B"), and the case of having no ball with the value of ratio of 1.05 or more was judged as very good (described as "A").

(Production of Test Pieces for HAST and HTS)

Regarding the palladium-coated copper bonding wire obtained in each of the examples, test pieces were produced as follows, and a bonding reliability evaluation was performed for the normal bonding and the narrow-pitch (small-diameter ball) bonding. By using the same fully automatic Cu wire bonder apparatus as above, wire bonding was performed on Al-1.0 mass % Si—0.5 mass % Cu alloy electrodes having a thickness of 2 μm on a 400-μm thick Si chip on a BGA (ball grid array) substrate under the same conditions as those for the free air ball, the ball bonding, and the second bonding in the normal bonding and the narrow-pitch bonding, respectively, in the circularity evaluation.

Regarding the condition of the first bonding, in Example 1 with the wire diameter φ of 18 μm, for example, a free air ball with a diameter of 32 μm was formed. Subsequently, the ball was bonded to an electrode by adjusting a ball crimping force to 7.5 gf, an ultrasonic application output to 70 mA, a ball crimping time to 15 ms, and a crimping temperature to 150° C. in the above-described fully automatic Cu wire bonder apparatus so as to make the height Y of the second ball compressed portion 20*b* to be 10 μm, and the maximum width $X_0$ of the second ball compressed portion 20*b* in a direction parallel to the bonding surface 21 to be 40 μm. Further, in the second bonding, wedge bonding was performed under conditions of, in a scrubbing mode, a crimping force of 70 gf, a crimping time of 20 ms, a crimping temperature of 150° C., a frequency of 200 kHz, an amplitude of 3.0 μm, and 2 cycles, and 1000 wires were bonded with a loop length of 2 mm.

At this time, only bonding portions adjacent to each other of the Al-1.0 mass % Si—0.5 mass % Cu alloy electrodes on the chip were electrically connected, the two wires adjacent to each other electrically form one circuit, and 500 circuits in total were formed. Thereafter, the Si chip on the BGA substrate was encapsulated in resin by using a commercially-available transfer molding machine (GPGP-PRO-LAB80 manufactured by Dai-ichi Seiko Co., Ltd.) to obtain a test piece. Note that for the encapsulating resin, a commercially-available non-halogen-free resin was used. Further, regarding the test pieces other than Example 1, ball bonding was performed so that the height Y of the second ball compressed portion 20*b* became 7 to 13 μm, and the maximum width $X_0$ of the second ball compressed portion 20*b* in a direction parallel to the bonding surface 21 became 1.2 times the diameter of the formed free air ball.

Regarding the conditions of the narrow-pitch (small-diameter ball) bonding, in Example 1 with the wire diameter φ of 18 μm, for example, a free air ball with a diameter of 30 μm was formed in the first bonding. Subsequently, the ball was bonded to an electrode by adjusting a ball crimping force to 7 gf, an ultrasonic application output to 65 mA, a ball crimping time to 15 ms, and a crimping temperature to 150° C. in the above-described fully automatic Cu wire bonder apparatus so as to make the height Y of the second ball compressed portion 20*b* to be 9 μm, and the maximum width $X_0$ of the second ball compressed portion 20*b* in a direction parallel to the bonding surface 21 to be 35 μm. Further, in the second bonding, wedge bonding was performed under conditions of, in a scrubbing mode, a crimping force of 70 gf, a crimping time of 20 ms, a crimping temperature of 150° C., a frequency of 200 kHz, an amplitude of 3.0 μm, and 2 cycles, and 1000 wires were bonded with a loop length of 2 mm. Regarding the test pieces other than Example 1, the first (ball) bonding was performed so that the height Y of the second ball compressed portion 20*b* became 6 to 12 μm, and the maximum width $X_0$ of the second ball compressed portion 20*b* in a direction parallel to the bonding surface 21 became 1.2 times the diameter of the formed free air ball. Note that when forming the free air ball, the conditions of the above-described fully automatic Cu wire bonder apparatus were adjusted so as to make the diameter of the free air ball to be about 1.5 to 1.7 times the wire diameter, in the same manner as the above-described free air ball analysis.

<HAST (Highly Accelerated Temperature and Humidity Stress Test)>

This test piece was held by using a HAST device (PCR8D manufactured by HTRAYAMA Manufacturing Corporation) at 130° C.×85.0% RH (relative humidity) for 400 hours and 600 hours. Before and after the holding, electrical resistance values of the 500 circuits described above were measured for each time period, and the case with at least one circuit in which the electrical resistance value after the holding exceeded 1.1 times the electrical resistance value before the holding was evaluated as defective (x), and the case where in all the 500 circuits, the resistance values were less than 1.1 times the resistance value was evaluated as excellent (⊚). After the 400-hour holding, the electrical resistances were less than 1.1 times the resistance value in all the samples.

<HTS (High Temperature Storage Test)>

Further, the test piece was held by using a HTS device (DRS420DA manufactured by ADVANTEC CO., LTD.) at 220° C. for 2000 hours. Before and after the holding, electrical resistance values of the 500 circuits were measured similarly to the above, and the case with at least one circuit where the electrical resistance value after the holding exceeded 1.1 times the electrical resistance value before the holding was evaluated as defective (x), and the case where in all the 500 circuits, the resistance values were less than 1.1 times the resistance value was evaluated as excellent (⊚). Evaluation results of the HAST test and the HTS test are shown in Tables 3, 4, 6. The "number of defects" in Table 4 is the number of circuits with the electrical resistance value after the holding exceeding 1.1 times the electrical resistance value before the holding.

<Analysis of Wire Bonding Structure>

Figure 5:
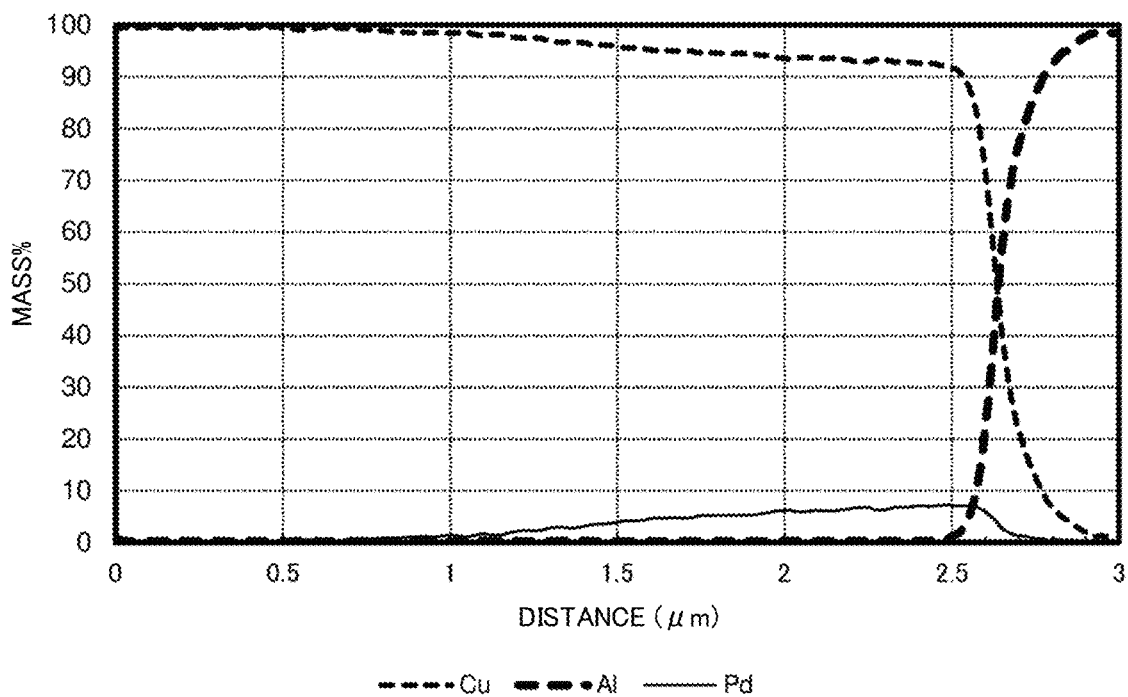
FIG. 5 is a field-emission scanning electron microscopy/ energy dispersive X-ray spectrometry (FE-SEM/EDX) profile of a bonding structure in the example.
Figure 6:
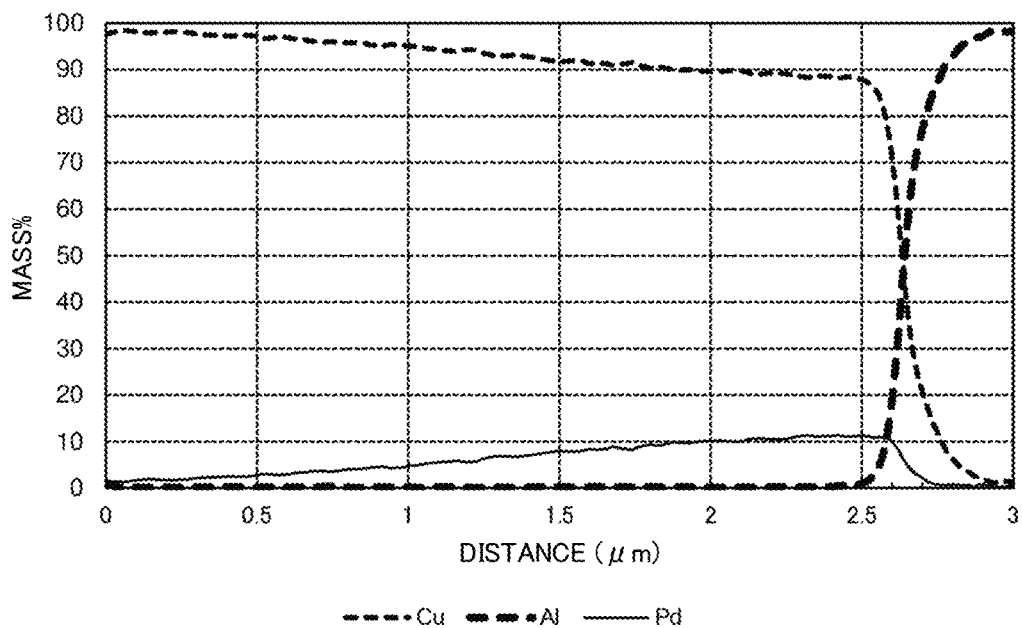
FIG. 6 is a FE-SEM/EDX profile of another portion of the bonding structure in the example.

The observation of the palladium-concentrated bonding region was performed as follows. The wire produced in Example 31 was used to form a free air ball under the same conditions as those when producing the test pieces for HAST and HTS described above. Subsequently, the conditions of ball bonding were adjusted in the bonder apparatus so as to make the height Y of the second ball compressed portion 20*b* to be 10 μm, and the maximum width $X_0$ of the second ball compressed portion 20*b* in a direction parallel to the bonding surface 21 to be 40 μm, to thereby form ball bonding on an aluminum electrode of a chip. The obtained ball bonding portion was molded by the above-described method, and cut by using an ion milling apparatus (IM4000 manufactured by Hitachi High-Technologies Corporation) so that a surface parallel to a center line in a wire longitudinal direction was exposed. The cut surface was subjected to a line analysis from predetermined places on the wire side in a direction vertical to the bonding surface, by using a field-emission scanning electron microscopy/energy dispersive X-ray spectrometry (FE-SEM/EDX). The analysis conditions include, as settings of the FE-SEM/EDX, an acceleration voltage of 6 keV, a measurement region φ of 0.18 μm, and a measurement interval of 0.02 μm. The line analysis places are the same as $P_1$, $P_2$ illustrated in FIG. 1. Specifically, the line analysis was performed so as to pass through points each positioned at a distance of one-eighth from each of both ends of the maximum width of the second ball compressed portion in the direction parallel to the bonding surface. The obtained FE-SEM/EDX profiles are shown in FIG. 5 and FIG. 6. From FIG. 5 and FIG. 6, it can be understood that in the vicinity of the bonding surface with aluminum of greater than 0.5 mass % and 95.0 mass % or less, there exists a palladium-concentrated bonding region having a ratio of palladium of 2.0 mass % or more relative to the total of aluminum, copper, and palladium. Further, a width (depth) of the palladium-concentrated bonding region was about 220 nm on the average of the two points.

Regarding Examples 32 to 39 as well, line analysis portions at two places same as above were subjected to the line analysis, in the same manner as above. When the palladium-concentrated bonding region with the concentration of palladium of 2.0 mass % or more relative to the total of aluminum, copper, and palladium was observed at both two places, it was judged as "present", and when the palladium-concentrated bonding region was not observed at both two places, it was judged as "absent". Note that there was no example in which the region was observed at only one of the two places. Results thereof are shown in Table 6. Halogen elements and moisture from an encapsulating resin and the like are highly likely to penetrate from small gaps or the like at both ends in the vicinity of the ball bonding surface. Accordingly, the presence of palladium-concentrated bonding regions with high corrosion resistance in the vicinity of both ends of the analyzed places can play a very important role in terms of prevention of penetration of halogen and so on. The depth (the width in the depth direction) of each of the line analysis portions where the palladium-concentrated bonding region was observed shown in Table 6 was 50 nm or more.

<Occupancy Ratio of Palladium-Concentrated Bonding Region>

The occupancy ratio of the palladium-concentrated bonding region was determined by the above-described method. Namely, the cut surface was observed through a surface analysis of electron probe microanalyzer (EPMA) (with an acceleration voltage of 15 kV and a current value of 290 nA), the palladium-concentrated bonding region was specified based on an intensity difference of palladium element, and a total width of a range where the palladium-concentrated bonding region was detected was set to $X_1$. The maximum width $X_0$ of the second ball compressed portion 20b at the bonding surface and the above-described total width $X_1$ were used to calculate the occupancy ratio (($X_1$/$X_0$)×100(%)). Further, when a point with the lowest intensity of palladium in the vicinity of the bonding surface 21 in the surface analysis of EPMA (a portion with the lightest color in the image) was subjected to the line analysis with the FE-SEM/EDX, it was confirmed that the concentration of palladium was 2.0 mass % or more relative to the total of aluminum, copper, and palladium. Specifically, it can be understood that all of the portions calculated as the occupancy ratio are the palladium-concentrated bonding regions.

Figure 8:
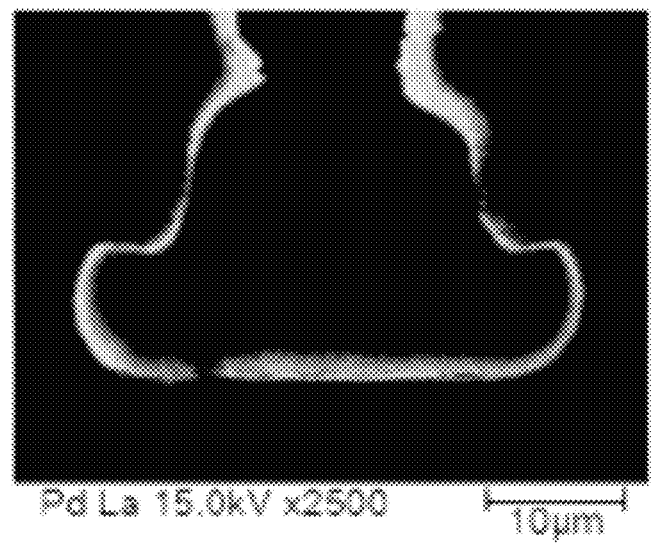
FIG. 8 is an electron probe microanalyzer (EPMA) image of the bonding structure in the example.
Figure 9:
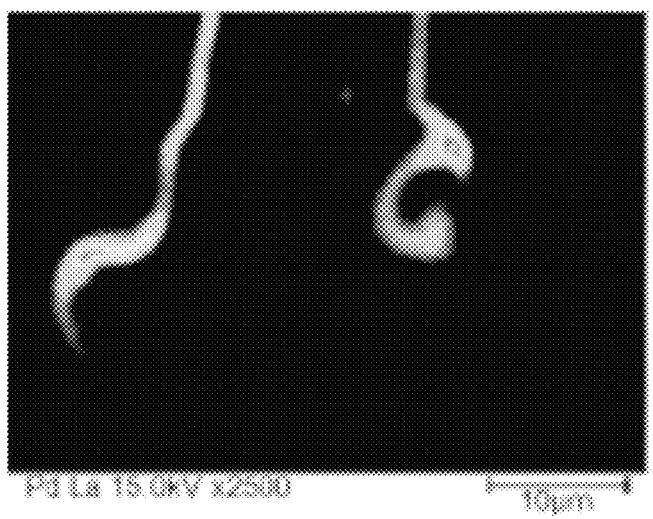
FIG. 9 is an EPMA image of a bonding structure in which no palladium exists in the vicinity of a bonding surface.

Note that in Examples 18 to 20, Pd plating was performed on a copper wire rod of 500 μm so that a thickness of the palladium coating layer became 1.8 μm in Example 18, 2.1 μm in Example 19, and 1.9 μm in Example 20 at a plated wire diameter. In the torsion test after the plating, a crack in the wire surface reached copper of the core material and a crack in the wire surface occurred, so that subsequent processing and evaluations were not performed. Further, the example in which a large shrinkage cavity was observed in the shrinkage cavity evaluation of the free air ball was judged as a nonconforming product, and no further evaluation was performed. Further, the evaluation of the circularity and the reliability evaluation of the narrow-pitch bonding were not performed regarding the example in which the evaluation of 600-hour HAST or HTS was "defective (x)" in the evaluation of normal bonding. The bonding structure was observed also in Example 17 in the same manner, FIG. 8 illustrates an EPMA image of Example 17, and FIG. 9 illustrates an EPMA image of a bonding structure with no presence of palladium in the vicinity of a bonding surface. Note that the EPMA image can be actually acquired as a color photograph.

TABLE 1

| | | | | | Pd-coated Cu bonding wire | | | | | | | |
|---|---|---|---|---|---|---|---|---|---|---|---|---|
| | | | | | | | | Pd | | | | |
| | | | | Trace element in core material | | Crystal orientation ratio of cross section (%) | | (derived from Pd | Sulfur group element | | Analysis of FAB-attached wire | |
| Example | Diameter of wire (μm) | Working ratio (%) | Elongation percentage (%) | Type | Amount in entire core material | ⟨111⟩ | ⟨100⟩ | ⟨111⟩ + ⟨100⟩ % | layer) (mass %) | (mass ppm) S Se Te | Discharge current (mA) | Diameter of FAB (μm) | Concentration of Pd (atom %) |
| Example 1 | 18 | 99.9 | 10 | — | — | 24.9 | 64.4 | 89.3 | 1.2 | 7 — — | 65 | 32 | 6.8 |
| Example 2 | 18 | 96.8 | 8 | Au | 0.5 mass % | 24.7 | 54.8 | 79.5 | 1.5 | — 8 — | 65 | 30 | 7.1 |
| Example 3 | 25 | 99.8 | 10 | — | — | 17.2 | 40.6 | 57.8 | 1.5 | — 8 — | 65 | 46 | 7.3 |
| 4 | 18 | 52 | 13 | — | — | 21.8 | 39.3 | 61.1 | 2.0 | — — 18 | 65 | 37 | 12.4 |
| 5 | 18 | 99.9 | 10 | Pt P | 0.2 mass % 50 massppm | 30.5 | 57.8 | 88.3 | 2.0 | — — 18 | 65 | 36 | 11.8 |

TABLE 1-continued

| | | | | | | | | | | | | | | |
|---|---|---|---|---|---|---|---|---|---|---|---|---|---|---|
| | Pd-coated Cu bonding wire | | | | | | | | | | | | | |
| | | | | Trace element in core material | | Crystal orientation ratio of cross section (%) | | | Pd (derived from Pd layer) (mass %) | Sulfur group element (mass ppm) | | | Analysis of FAB-attached wire | | |
| Example | Diameter of wire (μm) | Working ratio (%) | Elongation percentage (%) | Type | Amount in entire core material | ⟨111⟩ | ⟨100⟩ | ⟨111⟩ + ⟨100⟩ | | S | Se | Te | Discharge current (mA) | Diameter of FAB (μm) | Concentration of Pd (atom %) |
| 6 | 18 | 99.9 | 10 | Pt P | 2 mass % 100 massppm | 25.8 | 63.3 | 89.1 | 2.2 | 11 | — | — | 65 | 34 | 19.5 |
| 7 | 18 | 64 | 12 | Pd P | 0.2 mass % 200 massppm | 28.4 | 55.4 | 83.8 | 1.6 | — | — | 42 | 65 | 29 | 12.9 |
| 8 | 18 | 99.9 | 10 | Pd P | 2 mass % 50 massppm | 27.6 | 58.5 | 86.1 | 1.9 | — | — | 15 | 65 | 35 | 12.9 |
| 9 | 18 | 99.9 | 10 | Pt Pd P | 0.7 mass % 0.8 mass % 100 massppm | 30.2 | 55.8 | 86 | 2.4 | 11 | — | — | 65 | 35 | 18.7 |
| 10 | 18 | 99.9 | 10 | Pt Pd P | 0.5 mass % 0.2 mass % 200 massppm | 24.7 | 61.5 | 86.2 | 1.6 | — | — | 40 | 65 | 30 | 13.4 |
| 11 | 18 | 96.8 | 6 | — | — | 46.2 | 16.7 | 62.9 | 2.3 | 11 | — | — | 65 | 33 | 20.4 |
| 12 | 18 | 80 | 14 | P | 100 massppm | 19.2 | 64.7 | 83.9 | 1.3 | — | 18 | — | 65 | 37 | 11.5 |
| 13 | 18 | 87 | 10 | — | — | 23.9 | 41.5 | 65.4 | 1.6 | — | — | 48 | 65 | 28 | 13.5 |
| 14 | 18 | 99.9 | 12 | — | — | 28.7 | 55.6 | 84.3 | 2.1 | 7 | 6 | — | 65 | 32 | 16.0 |
| 15 | 18 | 99.2 | 11 | Rh | 0.2 mass % | 34.7 | 47.8 | 82.5 | 2.2 | — | 13 | 24 | 65 | 36 | 23.2 |
| 16 | 18 | 99.9 | 10 | Rh | 1.0 mass % | 32.5 | 46.5 | 79 | 2.2 | — | 13 | 24 | 65 | 35 | 21.9 |
| 17 | 18 | 99.9 | 8 | — | — | 41.5 | 34.7 | 76.2 | 2.4 | 6 | 7 | 15 | 65 | 29 | 28.0 |

TABLE 2

| | | | | | | | | | | | | | | | |
|---|---|---|---|---|---|---|---|---|---|---|---|---|---|---|---|
| | Pd-coated Cu bonding wire | | | | | | | | | | | | | | |
| | | | | Trace element in core material | | Crystal orientation ratio of cross section (%) | | | Pd (derived from Pd layer) (mass %) | Sulfur group element (mass ppm) | | | Analysis of FAB-attached wire | | |
| Example | Diameter of wire (μm) | Working ratio (%) | Elongation percentage (%) | Type | Amount in entire core material | ⟨111⟩ | ⟨100⟩ | ⟨111⟩ + ⟨100⟩ | | S | Se | Te | Discharge current (mA) | Diameter of FAB (μm) | Concentration of Pd (atom %) |
| Comparative example 18 | — | — | — | — | — | — | — | — | 1.9 | — | — | 55 | — | — | — |
| 19 | — | — | — | — | — | — | — | — | 2.2 | — | 28 | — | — | — | — |
| 20 | — | — | — | — | — | — | — | — | 2.0 | 15 | — | — | — | — | — |
| 21 | 18 | 96.8 | 8 | — | — | 39.8 | 23.2 | 63 | 4.1 | — | 10 | 26 | 65 | 30 | 33.5 |
| 22 | 18 | 99.9 | 10 | — | — | 25.6 | 62.3 | 87.9 | 0.8 | 6 | 18 | — | 65 | 35 | 3.5 |
| 23 | 18 | 99.2 | 10 | — | — | 33.5 | 47.6 | 81.1 | 1.6 | — | — | 10 | 65 | 37 | 5.2 |
| 24 | 18 | 87 | 8 | — | — | 26.4 | 39.8 | 66.2 | 1.3 | — | — | 12 | 65 | 28 | 5.5 |
| 25 | 18 | 80 | 4 | — | — | 55.2 | 6.7 | 61.9 | 1.2 | 7 | — | — | 65 | 32 | 6.6 |
| 26 | 18 | 84 | 5 | — | — | 51.2 | 15.4 | 66.6 | 1.3 | — | 18 | — | 65 | 37 | 10.8 |
| 27 | 18 | 33 | 6 | — | — | 25.6 | 9.4 | 35 | 2.0 | — | — | 18 | 65 | 37 | 12.1 |
| 28 | 18 | 30 | 7 | — | — | 26.2 | 11.2 | 37.4 | 1.5 | — | 8 | — | 65 | 46 | 6.9 |
| 29 | 18 | 64 | 6 | — | — | 32.3 | 13.5 | 45.8 | 2.3 | 11 | — | — | 65 | 33 | 19.8 |
| 30 | 18 | 74 | 6 | — | — | 45.6 | 9.6 | 55.2 | 2.4 | 6 | 7 | 15 | 65 | 31 | 28.3 |

TABLE 3

| | | | | Evaluation | | | | | | |
|---|---|---|---|---|---|---|---|---|---|---|
| | | | Normal bonding | | | | | Narrow-pitch (small-diameter ball) bonding | | |
| Example | Crack in wire surface | Shrinkage cavity evaluation | HAST 400 hrs | HAST 600 hrs | HTS | Circularity | Discharge current (mA) | Diameter of FAB (μm) | HAST 600 hrs | Circularity |
| Example 1 | ○ | ○ | ◎ | ◎ | ◎ | A | 65 | 30 | ◎ | B |
| 2 | ○ | ○ | ◎ | ◎ | ◎ | A | 65 | 27 | ◎ | B |
| 3 | ○ | ○ | ◎ | ◎ | ◎ | A | 65 | 38 | ○ | C |
| 4 | ○ | ○ | ◎ | ◎ | ◎ | A | 65 | 31 | ○ | C |
| 5 | ○ | ○ | ◎ | ◎ | ◎ | A | 65 | 30 | ◎ | B |
| 6 | ○ | ○ | ◎ | ◎ | ◎ | A | 65 | 27 | ◎ | B |
| 7 | ○ | ○ | ◎ | ◎ | ◎ | A | 65 | 31 | ◎ | B |
| 8 | ○ | ○ | ◎ | ◎ | ◎ | A | 65 | 30 | ◎ | B |
| 9 | ○ | ○ | ◎ | ◎ | ◎ | A | 65 | 27 | ◎ | B |
| 10 | ○ | ○ | ◎ | ◎ | ◎ | A | 65 | 31 | ◎ | B |
| 11 | ○ | ○ | ◎ | ◎ | ◎ | B | 65 | 30 | ○ | C |
| 12 | ○ | ○ | ◎ | ◎ | ◎ | A | 65 | 31 | ◎ | B |
| 13 | ○ | ○ | ◎ | ◎ | ◎ | A | 65 | 27 | ○ | B |
| 14 | ○ | ○ | ◎ | ◎ | ◎ | A | 65 | 28 | ○ | B |
| 15 | ○ | ○ | ◎ | ◎ | ◎ | A | 65 | 30 | ◎ | B |
| 16 | ○ | ○ | ◎ | ◎ | ◎ | A | 65 | 31 | ◎ | B |
| 17 | ○ | ○ | ◎ | ◎ | ◎ | B | 65 | 27 | ○ | B |

TABLE 4

| | | | | Evaluation | | | | | | |
|---|---|---|---|---|---|---|---|---|---|---|
| | | | Normal bonding | | | | | Narrow-pitch (small-diameter ball) bonding | | |
| Example | Crack in wire surface | Shrinkage cavity evaluation | HAST 400 hrs | HAST 600 hrs | HTS | Circularity | Discharge current (mA) | Diameter of FAB (μm) | HAST 600 hrs | Circularity |
| Comparative example 18 | X | — | — | — | — | — | — | — | — | — |
| 19 | X | — | — | — | — | — | — | — | — | — |
| 20 | X | — | — | — | — | — | — | — | — | — |
| 21 | ○ | X | ○ | X (17) | X (20) | B | — | — | — | — |
| 22 | ○ | ○ | ○ | X (8) | X (14) | A | — | — | — | — |
| 23 | ○ | ○ | ○ | X (4) | X (5) | B | — | — | — | — |
| 24 | ○ | ○ | ○ | X (3) | X (5) | B | — | — | — | — |
| 25 | ○ | ○ | ◎ | ◎ | ◎ | C | 65 | 30 | ○ | D |
| 26 | ○ | ○ | ◎ | ◎ | ◎ | C | 65 | 31 | ○ | D |
| 27 | ○ | ○ | ◎ | ◎ | ◎ | C | 65 | 31 | ○ | D |
| 28 | ○ | ○ | ◎ | ◎ | ◎ | C | 65 | 40 | ○ | D |
| 29 | ○ | ○ | ◎ | ◎ | ◎ | C | 65 | 30 | ○ | D |
| 30 | ○ | ○ | ◎ | ◎ | ◎ | C | 65 | 27 | ○ | D |

TABLE 5

| | | | | | Pd-coated Cu bonding wire | | | | | | | | | |
|---|---|---|---|---|---|---|---|---|---|---|---|---|---|---|
| | | | | | Trace element in core material | | Crystal orientation ratio of cross section (%) | | | Pd (derived from Pd layer) (mass %) | Sulfur group element (mass ppm) | | | Analysis of FAB-attached wire |
| Example | Diameter of wire (μm) | Working ratio (%) | Elongation percentage (%) | Type | Amount in entire core material | ⟨111⟩ | ⟨100⟩ | ⟨111⟩ + ⟨100⟩ | Gold layer (μm) | | S | Se | Te | Discharge current (mA) | Diameter of ball (μm) | Concentration of Pd of surface (atom %) |
| Example 31 | 18 | 99.9 | 10 | In | 500 massppm | 25.6 | 62.3 | 87.9 | — | 1.2 | 7 | — | — | 65 | 36 | 6.9 |
| 32 | 18 | 52 | 12 | — | — | 24.3 | 35.4 | 59.7 | — | 1.2 | 7 | — | — | 30 | 30 | 7.1 |
| 33 | 18 | 87 | 10 | — | — | 22.5 | 41.8 | 64.3 | — | 1.2 | 7 | — | — | 80 | 36 | 6.6 |
| 34 | 25 | 99.8 | 8 | Pd | 2.3 mass % | 20.1 | 43.8 | 63.9 | — | 1.6 | 7 | — | — | 90 | 45 | 15.3 |
| 35 | 18 | 96.8 | 10 | Ni | 0.3 mass % | 33.3 | 45.7 | 79 | — | 2.4 | 6 | 7 | 15 | 65 | 29 | 12.4 |
| 36 | 18 | 96.8 | 10 | Ni | 1.0 mass % | 29.1 | 46.8 | 75.9 | — | 2.4 | 6 | 8 | 14 | 65 | 30 | 11.9 |
| 37 | 18 | 87 | 10 | — | — | 23.8 | 42.1 | 65.9 | 2 | 1.2 | 7 | — | — | 90 | 35 | 6.7 |
| 38 | 18 | 80 | 11 | — | — | 25.3 | 44.2 | 69.5 | 4 | 1.5 | — | 8 | — | 65 | 40 | 6.6 |
| 39 | 18 | 99.9 | 10 | Pt | 0.5 mass % | 28.8 | 61.3 | 90.1 | 6 | 2.0 | — | — | 18 | 30 | 42 | 6.7 |

TABLE 5-continued

Pd-coated Cu bonding wire

| | | | | | Trace element in core material | | Crystal orientation ratio of cross section (%) | | | Pd (derived from Pd layer | | Sulfur group element (mass ppm) | | | Analysis of FAB-attached wire | | |
|---|---|---|---|---|---|---|---|---|---|---|---|---|---|---|---|---|---|
| Example | Diameter of wire (µm) | Working ratio (%) | Elongation percentage (%) | Type | Amount in entire core material | ⟨111⟩ | ⟨100⟩ | ⟨111⟩ + ⟨100⟩ | Gold layer (µm) | layer) (mass %) | S | Se | Te | Discharge current (mA) | Diameter of ball (µm) | Concentration of Pd of surface (atom %) |
| Comparative 40 | 18 | 80 | 4 | — | — | 53.2 | 8.2 | 61.4 | — | 1.2 | 7 | — | — | 90 | 36 | 6.6 |
| 41 | 18 | 74 | 5 | — | — | 49.6 | 9.2 | 58.8 | — | 1.3 | — | 8 | — | 30 | 50 | 6.8 |
| 42 | 18 | 33 | 5 | — | — | 23.5 | 10.2 | 33.7 | — | 2.0 | — | — | 19 | 30 | 50 | 8.7 |
| Example 43 | 18 | 64 | 6 | — | — | 29.8 | 13.2 | 43 | — | 2.4 | 6 | 7 | 15 | 65 | 29 | 10.3 |

TABLE 6

| | | Pd-concentrated bonding region | | | Normal bonding | | | | Narrow-pitch (small-diameter ball) bonding | | | |
|---|---|---|---|---|---|---|---|---|---|---|---|---|
| Example | | Presence/ absence | Occupancy ratio (%) | Shrinkage cavity evaluation | HAST 400 hrs | HAST 600 hrs | HTS | Circularity | Discharge current (mA) | Diameter of FAB (µm) | HAST 600 hrs | Circularity |
| Example | 31 | Present | 60 | ○ | ◎ | ◎ | ◎ | A | 65 | 30 | ◎ | B |
| | 32 | Present | 40 | ○ | ◎ | ◎ | ◎ | A | 30 | 27 | ○ | C |
| | 33 | Present | 65 | ○ | ◎ | ◎ | ◎ | A | 80 | 31 | ○ | C |
| | 34 | Present | 85 | ○ | ◎ | ◎ | ◎ | A | 90 | 38 | ◎ | C |
| | 35 | Present | 95 | ○ | ◎ | ◎ | ◎ | A | 65 | 27 | ◎ | B |
| | 36 | Present | 95 | ○ | ◎ | ◎ | ◎ | A | 65 | 27 | ◎ | B |
| | 37 | Present | 90 | ○ | ◎ | ◎ | ◎ | A | 90 | 31 | ○ | C |
| | 38 | Present | 70 | ○ | ◎ | ◎ | ◎ | A | 65 | 28 | ○ | C |
| | 39 | Present | 100 | ○ | ◎ | ◎ | ◎ | A | 30 | 30 | ◎ | B |
| Comparative example | 40 | Present | 60 | ○ | ◎ | ◎ | ◎ | C | 90 | 31 | ○ | D |
| | 41 | Present | 30 | ○ | ◎ | ◎ | ◎ | B | 30 | 30 | ○ | D |
| | 42 | Present | 65 | ○ | ◎ | ◎ | ◎ | C | 30 | 30 | ○ | D |
| | 43 | Present | 70 | ○ | ◎ | ◎ | ◎ | B | 65 | 27 | ○ | D |

From Tables 1 to 6, according to the palladium-coated copper bonding wire having 1.0 to 4.0 mass % of the concentration of palladium in the entire wire, containing sulfur, selenium, and tellurium with concentrations in predetermined ranges, respectively, and including the palladium-concentrated region containing 6.5 to 30.0 atom % of palladium in the surface of the solidified free air ball, the occurrence of the shrinkage cavity can be suppressed, and in addition to that, excellent reliability in the HAST and the HTS is provided. Besides, it can be understood that according to the palladium-coated copper bonding wire having the <100> orientation ratio of the cross section of the wire of 15% or more and the <111> orientation ratio of the cross section of the wire of 50% or less (each of the <100> orientation and the <111> orientation includes an orientation with an angular difference relative to the wire longitudinal direction of up to within 15°), the circularity of the small-diameter ball is quite excellent, and the short failure can be reduced.

For example, in the above-described device for automobile use, the biggest problem is the bonding life of the ball bonding portion (first bonding) where the free air ball and the electrode are bonded in particular. The device for automobile use is required to meet the condition that the resistance value of the semiconductor device, where the aluminum electrode and the ball are bonded to be resin-encapsulated, after the exposure for a long period of time in the HAST needs to be suppressed to an increase of 1.1 times or less the resistance value before the exposure. It is the halogen elements such as chlorine and the moisture, which are contained in the resin used for the encapsulation to be performed after ball bonding, that adversely affect the bonding life, namely, the increase in resistance value. These chlorine and moisture corrode the intermetallic compound generated in the ball bonding portion, causing the resistance value of the bonding portion to increase. The increase in resistance value causes poor current flow and interferes with the transmission of electrical signals, and in the case of automotive applications, the increase in resistance value may lead to automobile accidents. In the palladium-coated copper bonding wires in the above-described examples, the results of the HAST test are all good even after 600-hour exposure, thus indicating that the bonding reliability is high and such a serious problem as above is not caused even when they are used for the devices for automobile use.

As shown in Table 6, the evaluations of the shrinkage cavity, the HAST, and the HTS regarding the palladium-coated copper bonding wire having the gold layer were good similarly to those of the palladium-coated copper bonding wire having no gold layer. It can be considered that this is because the amount of gold derived from the gold layer was very small as compared to the gold to adhere during the second bonding, and because gold covered the entire wire and did not flocculate locally, and thus no shrinkage cavity occurred.

<HAST Test with Severe Specifications>

Next, the palladium-coated copper bonding wire in a predetermined example was evaluated for chip damage and the HAST test, in which the set temperature was increased by 5° C. to set severe specifications at 135° C. for 600 hours. Chip damage performance was evaluated by performing ball bonding using the palladium-coated copper bonding wire obtained in each of the examples shown in Table 7 under the same conditions, and observing the substrate directly under the ball bonding portion with an optical microscope. One hundred ball bonding portions were observed. Example 17 was marked as good (○) because there was one small crack that did not cause any particular problem in use. The other examples were marked as excellent (◎) because no cracks occurred at all. In the HAST test with severe specifications, as in the normal HAST test, the example in which the electrical resistance value after the test was less than 1.1 times the value before the test was evaluated as ◎, and the example in which the electrical resistance value after the test was 1.1 times or more and 1.2 times or less the value before the test was evaluated as ○. Note that in Example 1, in five of the 500 circuits, the electrical resistance value after the test was 1.1 times or more and 1.2 times or less the value before the test, but in all of the other circuits, the electrical resistance value after the test was less than 1.1 times the value before the test. As an overall evaluation, the example in which the result of the chip damage evaluation and the result of the HAST test with severe specifications are both ◎ was evaluated as ◎, and the example in which one of them is ○ and the other of them is ◎ was evaluated as ○. Results are shown in Table 7.

concentration of palladium of the palladium-concentrated region was 7.0 atom % or more. Further, in the examples where the concentration of palladium of the surface of the tip portion of the free air ball was 23.0 atom % or less, no chip damage occurred, while in Example 17 where the concentration was greater than 25.0 atom %, a small amount of chip damage occurred, which did not cause any problem though. These reveal that the concentration of palladium of the surface of the free air ball is preferably 7.0 atom % or more and 25.0 atom % or less. The palladium-coated copper bonding wire where the concentration of palladium of the surface of the free air ball is 7.0 atom % or more and 25.0 atom % or less is suitable for devices for automobile use and also enables an improvement in yield.

What is claimed is:

1. A palladium-coated copper bonding wire for ball bonding, comprising: a core material containing copper as a main component; and a palladium layer on the core material, and containing a sulfur group element, wherein:
   the palladium-coated copper bonding wire contains, relative to the total of copper, palladium, and the sulfur group element:
   palladium of 1.0 mass % or more and 4.0 mass % or less; and the sulfur group element of 50 mass ppm or less in total, the sulfur group element including
   sulfur of 5.0 mass ppm or more and 12.0 mass ppm or less,
   selenium of 5.0 mass ppm or more and 20.0 mass ppm or less, or
   tellurium of 15.0 mass ppm or more and 50.0 mass ppm or less;
   in crystal orientations <hkl> in a wire longitudinal direction at a crystal plane of a cross section of the palladium-coated copper bonding wire, a <100> orientation

TABLE 7

| | Pd-coated Cu bonding wire | | | | | | | | |
|---|---|---|---|---|---|---|---|---|---|
| | | Trace element in core material | | Concentration of sulfur group element in entire wire (mass ppm) | | | Concentration of Pd of surface of FAB (atom %) | Evaluation | | |
| Example | Concentration of Pd in entire wire (mass %) | Type | Amount in entire core material | S | Se | Te | | Chip damage | HAST (severe specifications) | Overall evaluation |
| Example 1 | 1.2 | — | — | 7 | — | — | 6.8 | ◎ | ○ | ○ |
| 2 | 1.5 | Au | 0.5 mass % | — | 8 | — | 7.1 | ◎ | ◎ | ◎ |
| 4 | 2.0 | — | — | — | — | 18 | 12.4 | ◎ | ◎ | ◎ |
| 11 | 2.3 | — | — | 11 | — | — | 20.4 | ◎ | ◎ | ◎ |
| 12 | 1.3 | P | 100 massppm | — | 18 | — | 11.5 | ◎ | ◎ | ◎ |
| 13 | 1.6 | — | — | — | — | 48 | 13.5 | ◎ | ◎ | ◎ |
| 14 | 2.1 | — | — | 7 | 6 | — | 16.0 | ◎ | ◎ | ◎ |
| 15 | 2.2 | Rh | 0.2 mass % | — | 13 | 24 | 23.2 | ◎ | ◎ | ◎ |
| 17 | 2.4 | — | — | 6 | 7 | 15 | 28.0 | ○ | ◎ | ○ |

From Table 7, it can be understood that Examples 2, 4, 11 to 15, and 17 where the concentration of palladium of the surface of the tip portion of the free air ball (palladium-concentrated region) is 7.0 atom % or more can withstand even the HAST test performed under the conditions more severe than usual, where the temperature was set to 135° C. It can be understood that Example 1 where the concentration of palladium of the surface of the tip portion of the free air ball was 6.8 atom % had some of the resistance values that were 1.1 times or more and 1.2 times or less after the test, which was slightly inferior to the examples where the ratio is 15% or more in total, and a <111> orientation ratio is 50% or less, the <100> orientation and the <111> orientation including an orientation with an angular difference relative to the wire longitudinal direction of within 15°; and wherein the palladium-coated copper bonding wire is configured to form a free air ball on a tip of the palladium-coated copper bonding wire during ball bonding, and the free air ball includes a palladium-concentrated region containing palladium of 6.5 atom % or more and 30.0 atom % or less relative to the total of copper and palladium in a range from a surface of a tip portion of the free air ball to 5.0 nm or more and 100.0 nm or less in a depth direction.

2. The palladium-coated copper bonding wire according to claim 1, wherein the core material contains one or more of trace elements selected from P, Au, Pd, Pt, Ni, Ag, Rh, In, Ga, and Fe, of 1 mass ppm or more and 3 mass % or less in total relative to the entire core material.

3. The palladium-coated copper bonding wire according to claim 1, wherein the core material contains one or more of trace elements selected from P, Au, Pd, Pt, Ni, Ag, Rh, In, Ga, and Fe, wherein the core material contains the trace element including at least one of Au, Pd, Pt, Ni, and Rh of 0.05 mass % or more and 3 mass % or less, the trace element including at least one of In and Ga of 0.01 mass % or more and 0.7 mass % or less, the trace element including P of 5 mass ppm or more and 500 mass ppm or less, or the trace element including at least one of Ag and Fe of 1 mass ppm or more and 100 mass ppm or less.

4. The palladium-coated copper bonding wire according to claim 1, wherein the palladium-coated copper bonding wire contains palladium derived from the palladium layer of 1.0 mass % or more and 2.5 mass % or less relative to the total of copper, palladium, and the sulfur group element.

5. The palladium-coated copper bonding wire according to claim 1, wherein the palladium-coated copper bonding wire has a diameter of 10 μm or more and 25 μm or less.

6. The palladium-coated copper bonding wire according to claim 1, wherein the free air ball is formed by applying a discharge current of 65 mA to the palladium-coated copper bonding wire in the presence of a mixed gas of nitrogen and hydrogen, and the free air ball has a diameter which is 1.8 times a diameter of the palladium-coated copper bonding wire.

7. The palladium-coated copper bonding wire according to claim 1, wherein the concentration of palladium of the palladium-concentrated region is measured by an Auger electron spectroscopy analysis under the following conditions: an acceleration voltage of a primary electron beam: 10 kV; a measurement region calculated from a set value: 15 $\mu m^2$ or more and 20 $\mu m^2$ or less; an acceleration voltage of argon ion for sputtering: 1 kV; and a sputtering rate: 2.5 nm/minute (in terms of $SiO_2$).

8. The palladium-coated copper bonding wire according to claim 1, further comprising a gold layer on the palladium layer.

9. The palladium-coated copper bonding wire according to claim 1, wherein the palladium-coated copper bonding wire contains sulfur(S) of 6.0 mass ppm or more and 10.0 mass ppm or less relative to the entire wire.

10. The palladium-coated copper bonding wire according to claim 1, wherein the palladium-coated copper bonding wire contains selenium (Se) of 6.0 mass ppm or more and 15.0 mass ppm or less relative to the entire wire.

11. The palladium-coated copper bonding wire according to claim 1, wherein the palladium-coated copper bonding wire contains tellurium (Te) of 16.0 mass ppm or more and 45.0 mass ppm or less relative to the entire wire.

12. A semiconductor device, comprising:
a semiconductor chip; an aluminum-containing aluminum electrode provided on the semiconductor chip; a gold or silver-coated external electrode provided outside the semiconductor chip; and a bonding wire connecting the aluminum electrode and a surface of the external electrode, wherein the bonding wire is made of the palladium-coated copper bonding wire according to claim 1.

13. A manufacturing method of a semiconductor device, the semiconductor device comprising: a semiconductor chip; an aluminum-containing aluminum electrode provided on the semiconductor chip; a gold or silver-coated external electrode provided outside the semiconductor chip; and a bonding wire connecting the aluminum electrode and a surface of the external electrode, wherein
the bonding wire is a palladium-coated copper bonding wire including: a core material containing copper as a main component; and a palladium layer on the core material, and containing a sulfur group element, wherein:
the palladium-coated copper bonding wire contains, relative to the total of copper, palladium, and the sulfur group element:
palladium of 1.0 mass % or more and 4.0 mass % or less; and the sulfur group element of 50 mass ppm or less in total, the sulfur group element including
sulfur of 5.0 mass ppm or more and 12.0 mass ppm or less,
selenium of 5.0 mass ppm or more and 20.0 mass ppm or less, or
tellurium of 15.0 mass ppm or more and 50.0 mass ppm or less;
in crystal orientations <hkl> in a wire longitudinal direction at a crystal plane of a cross section of the palladium-coated copper bonding wire, a <100> orientation ratio is 15% or more in total, and a <111> orientation ratio is 50% or less, the <100> orientation and the <111> orientation including an orientation with an angular difference relative to the wire longitudinal direction of within 15°; and
wherein the palladium-coated copper bonding wire is configured to form a free air ball on a tip of the palladium-coated copper bonding wire, and the free air ball includes a palladium-concentrated region containing palladium of 6.5 atom % or more and 30.0 atom % or less relative to the total of copper and palladium, in a range from a surface of a tip portion of the free air ball to 5.0 nm or more and 100.0 nm or less in a depth direction, and
the manufacturing method comprising:
forming the free air ball at the tip of the palladium-coated copper bonding wire;
ball-bonding the palladium-coated copper bonding wire to the aluminum electrode via the free air ball; and
making a portion of the palladium-coated copper bonding wire apart from the free air ball by a length of the palladium-coated copper bonding wire to be bonded to the surface of the external electrode.

* * * * *